(12) United States Patent
Hwang

(10) Patent No.: US 11,302,392 B2
(45) Date of Patent: Apr. 12, 2022

(54) ANALOG-TO-DIGITAL CONVERTER AND NEUROMORPHIC COMPUTING DEVICE INCLUDING THE SAME

(71) Applicant: Samsung Electronics Co., Ltd., Suwon-si (KR)

(72) Inventor: Youngnam Hwang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/783,408

(22) Filed: Feb. 6, 2020

(65) Prior Publication Data

US 2020/0411091 A1    Dec. 31, 2020

(30) Foreign Application Priority Data

Jun. 26, 2019    (KR) .................. 10-2019-0076349

(51) Int. Cl.
*G11C 11/00* (2006.01)
*G11C 13/00* (2006.01)
(Continued)

(52) U.S. Cl.
CPC ....... *G11C 13/0069* (2013.01); *G06N 3/0635* (2013.01); *G11C 13/0023* (2013.01); *H03M 1/12* (2013.01); *G11C 2213/79* (2013.01)

(58) Field of Classification Search
CPC ...... G06N 3/0635; G06N 3/08; G06N 3/0454; G06N 3/0445; G06N 3/0472; H03M 1/12; H03M 1/365; H03M 1/089; H03M 1/06; G11C 13/0069; G11C 13/0023; G11C 2213/79; G11C 13/004; G11C 11/54
See application file for complete search history.

(56) References Cited

U.S. PATENT DOCUMENTS 6,304,539 B1    10/2001    Okamoto
8,081,816 B1    12/2011    Irick et al.
(Continued)

FOREIGN PATENT DOCUMENTS

JP    06175622    6/1994
JP    3764269 B2    4/2006
(Continued)

*Primary Examiner* — Uyen Smet
(74) *Attorney, Agent, or Firm* — Harness, Dickey & Pierce, P.L.C.

(57) ABSTRACT

An analog-to-digital converter is connected to a crossbar array including a plurality of resistive memory cells. Each of the plurality of resistive memory cells includes a resistive element. The analog-to-digital converter includes a voltage generator and processing circuitry. The voltage generator includes at least one resistive memory element including a same resistive material as the resistive element included in the crossbar array, and is configured to generate a first voltage based on a reference voltage and the at least one resistive memory element and to divide the first voltage to generate at least one divided voltage. The processing circuitry is configured to compare a signal voltage generated from the crossbar array with the at least one divided voltage to generate at least one comparison signal and generate at least one digital signal corresponding to the signal voltage based on the at least one comparison signal.

20 Claims, 16 Drawing Sheets

(51) Int. Cl.
   *G06N 3/063*   (2006.01)
   *H03M 1/12*   (2006.01)

(56) References Cited

U.S. PATENT DOCUMENTS

| | | | |
|---|---|---|---|
| 10,211,856 B1 | 2/2019 | Petre et al. | |
| 2008/0309534 A1* | 12/2008 | Baker | G11C 7/02 341/143 |
| 2013/0076550 A1* | 3/2013 | Marukame | H01L 27/22 341/158 |
| 2018/0089558 A1 | 3/2018 | Wittenberg et al. | |
| 2019/0026627 A1 | 1/2019 | Hatcher et al. | |

FOREIGN PATENT DOCUMENTS

| | | |
|---|---|---|
| JP | 2014-0160939 A | 9/2014 |
| JP | 2016-0082312 A | 5/2016 |
| JP | 2018-0160007 A | 10/2018 |

* cited by examiner

ANALOG-TO-DIGITAL CONVERTER AND NEUROMORPHIC COMPUTING DEVICE INCLUDING THE SAME

CROSS-REFERENCE TO RELATED APPLICATION

This application claims priority under 35 USC § 119 to Korean Patent Application No. 10-2019-0076349, filed on Jun. 26, 2019 in the Korean Intellectual Property Office (KIPO), the contents of which are herein incorporated by reference in their entirety.

BACKGROUND

1. Technical Field

Some example embodiments relate generally to semiconductor integrated circuits, and more particularly to analog-to-digital converters and neuromorphic computing devices including the analog-to-digital converters.

2. Description of the Related Art

Some applications involving Deep-Learning Neural Networks (NNs) or neuromorphic computing such as image recognition, natural language processing and more generally various pattern-matching or classification tasks are quickly becoming as important as general-purpose computing. The computational element of an example NN, or neuron, multiplies of a set of input signals by a set of weights and sums the products. Thus, the neuron performs a vector-matrix product, or multiply-accumulate (MAC) operation. A NN may include a large number of interconnected neurons, each of which performs a MAC operation. Thus, operation of a NN may be computationally intensive.

A neuromorphic computing device or a neuromorphic chip is a semiconductor circuit that is manufactured by simulating, replicating or copying information processing methods using an artificial neural system at the neuron level. The neuromorphic computing devices may be used to implement intelligent systems that may adapt themselves to dynamic and/or uncertain environments.

SUMMARY

At least one example embodiment of the present disclosure includes an analog-to-digital converter capable of performing an analog-to-digital conversion without temperature and time dependency.

At least one example embodiment of the present disclosure includes a neuromorphic computing device including the analog-to-digital converter.

According to some example embodiments, an analog-to-digital converter is connected to a crossbar array including a plurality of resistive memory cells. Each of the plurality of resistive memory cells includes a resistive element. The analog-to-digital converter includes a voltage generator and processing circuitry. The voltage generator includes at least one resistive memory element including a same resistive material as the resistive element included in the crossbar array, generates a first voltage based on a reference voltage and the at least one resistive memory element, and divides the first voltage to generate at least one divided voltage. The processing circuitry may be configured to compare a signal voltage from the crossbar array with at least one divided voltage to generate at least one comparison signal and to generate at least one digital signal corresponding to the signal voltage based on the at least one comparison signal.

According to some example embodiments, a neuromorphic computing device includes a crossbar array and at least one analog-to-digital converter. The crossbar array includes a plurality of resistive memory cells, stores at least one data, and generates at least one signal voltage based on at least one input voltage and the at least one data. Each of the plurality of resistive memory cells including a resistive element. The at least one analog-to-digital converter converts the at least one signal voltage into at least one digital signal. Each of the at least one analog-to-digital converter includes at least one resistive memory element including a same resistive material as the resistive element included in the crossbar array, generates a first voltage based on a reference voltage and the at least one resistive memory element, divides the first voltage to generate at least one divided voltage, compares one of the at least one signal voltage with the at least one divided voltage to generate at least one comparison signal, and generates one of the at least one digital signals based on the at least one comparison signal.

According to some example embodiments, a neuromorphic computing device includes a crossbar array, a first switching matrix, a second switching matrix, a plurality of current-to-voltage converters, a plurality of analog-to-digital converters, a plurality of adders and a plurality of shift registers. The crossbar array includes a plurality of resistive memory cells that are configured to store a plurality of weights included in at least one layer of a neural network system, and to generate a plurality of read currents based on a plurality of input voltages and the plurality of weights. Each of the plurality of resistive memory cells includes a resistive element. The plurality of read currents represent a result of multiplication and accumulation operations performed by the neural network system. The first switching matrix is connected to a plurality of rows of the crossbar array. The second switching matrix is connected to a plurality of columns of the crossbar array. The plurality of current-to-voltage converters convert the plurality of read currents into a plurality of signal voltages. The plurality of analog-to-digital converters convert the plurality of signal voltages into a plurality of digital signals. The plurality of adders sum the plurality of digital signals. The plurality of shift registers generate final output data based on an output of the plurality of adders. Each of the plurality of analog-to-digital converters includes a voltage generator and processing circuitry. The voltage generator includes at least one resistive memory element including a same resistive material as the resistive element included in the crossbar array, generates a first voltage based on a reference voltage and the at least one resistive memory element, and divides the first voltage to generate at least one divided voltage. The reference voltage is a voltage independent with respect to temperature and time. The processing circuitry may be configured to compare one of the at least one signal voltages with the at least one divided voltage to generate at least one comparison signal and to generate one of the at least one digital signal based on the at least one comparison signal.

In the analog-to-digital converter and the neuromorphic computing device according to some example embodiments, the analog-to-digital converter may include at least one resistive memory element that includes the same or similar resistive material as the resistive element included in the crossbar array. Thus, the read current output from the crossbar array, the signal voltage corresponding to the read current and the first voltage generated and used in the analog-to-digital converter may have the same or similar temperature and time dependency, and a digital signal that does not change (or does not significantly change) depending on temperature and time may be generated when the output of the crossbar array is analog-to-digital converted.

BRIEF DESCRIPTION OF THE DRAWINGS

Some illustrative, non-limiting example embodiments will be more clearly understood from the following detailed description taken in conjunction with the accompanying drawings.

DETAILED DESCRIPTION

Figure 1:
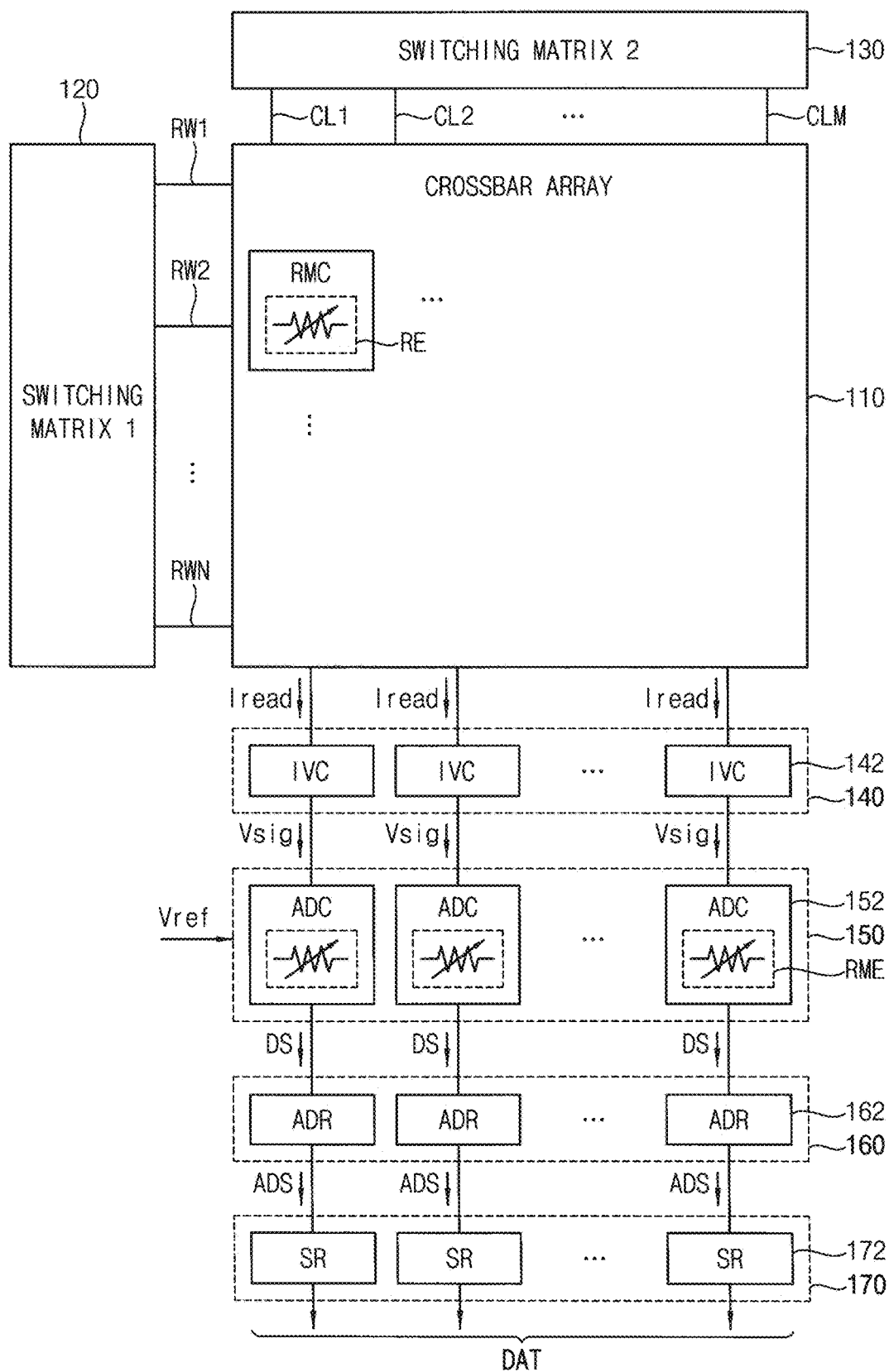
FIG. 1 is a block diagram illustrating a neuromorphic computing device according to some example embodiments.

Various example embodiments will be described more fully with reference to the accompanying drawings, in which some example embodiments are shown. The present disclosure may, however, be embodied in many different forms and should not be construed as limited to some example embodiments set forth herein. Like reference numerals refer to like elements throughout this application.

FIG. 1 is a block diagram illustrating a neuromorphic computing device according to some example embodiments.

Referring to FIG. 1, a neuromorphic computing device 100 includes a crossbar array 110 and an analog-to-digital conversion block 150. The neuromorphic computing device 100 may further include a first switching matrix 120, a second switching matrix 130, a current-to-voltage conversion block 140, an adder block 160 and a shift register block 170.

The crossbar array 110 includes a plurality of resistive memory cells RMC that are arranged in a matrix formation. Each of the plurality of resistive memory cells RMC includes a resistive element RE. Each of the plurality of resistive memory cells RMC may be connected to a respective one of a plurality of rows RW1, RW2, ..., RWN and a respective one of a plurality of columns CL1, CL2, ..., CLM, where each of N and M is a natural number greater than or equal to two. Detailed configurations of the crossbar array 110 will be described with reference to FIGS. 3A and 3C.

The crossbar array 110 stores a plurality of data. For example, the plurality of data may be stored in the plurality of resistive memory cells RMC by using a resistance change of the resistive element RE included in each of the plurality of resistive memory cells RMC. The crossbar array 110 generates a plurality of read currents Iread corresponding to a plurality of signal voltages Vsig based on a plurality of input voltages and the plurality of data. For example, the plurality of input voltages may be input to the crossbar array 110 through the plurality of rows RW1, RW2, ..., RWN.

In some example embodiments, as will be described with reference to FIGS. 2A and 2B, the neuromorphic computing device 100 may be used to drive at least one of various neural network systems and/or machine learning systems, e.g., an artificial neural network (ANN) system, a convolutional neural network (CNN) system, a deep neural network (DNN) system, a deep learning system, or the like. Such machine learning systems may include a variety of learning models, such as convolutional neural networks (CNN), deconvolutional neural networks, recurrent neural networks (RNN) optionally including long short-term memory (LSTM) units and/or gated recurrent units (GRU), stacked neural networks (SNN), state-space dynamic neural networks (SSDNN), deep belief networks (DBN), generative adversarial networks (GANs), and/or restricted Boltzmann machines (RBM). Alternatively or additionally, such machine learning systems may include other forms of machine learning models, such as, for example, linear and/or logistic regression, statistical clustering, Bayesian classification, decision trees, dimensionality reduction such as principal component analysis, and expert systems; and/or combinations thereof, including ensembles such as random forests. Such machine learning models may also be used to provide various services and/or applications, e.g., an image classify service, a user authentication service based on bio-information or biometric data, an advanced driver assistance system (ADAS) service, a voice assistant service, an automatic speech recognition (ASR) service, or the like, may be performed, executed or processed by the neuromorphic computing device 100.

In this example, the plurality of data stored in the crossbar array 110 may represent a plurality of weights included in at least one layer of a neural network system, and the plurality of read currents Iread and the plurality of signal voltages Vsig may represent a result of multiplication and accumulation operations performed by the neural network system. In other words, the crossbar array 110 may perform a data storage operation and a data computation (or calculation) operation at once, which will be described with reference to FIG. 3B.

The first switching matrix 120 may be connected to the plurality of rows RW1, RW2, ..., RWN of the crossbar array 110. Although not illustrated in detail, the first switching matrix 120 may drive the plurality of rows RW1, RW2, ..., RWN based on row selection signals for selecting at least one of the plurality of rows RW1, RW2, ..., RWN and/or row driving voltages for driving at least one of the plurality of rows RW1, RW2, ..., RWN.

The second switching matrix 130 may be connected to the plurality of columns CL1, CL2, ..., CLM of the crossbar array 110. Although not illustrated in detail, the second switching matrix 130 may drive the plurality of columns CL1, CL2, ..., CLM based on column selection signals for selecting at least one of the plurality of columns CL1, CL2, ..., CLM and/or column driving voltages for driving at least one of the plurality of columns CL1, CL2, ..., CLM.

The current-to-voltage conversion block 140 may include a plurality of current-to-voltage converters (IVCs) 142. The plurality of current-to-voltage converters 142 may convert the plurality of read currents Iread into the plurality of signal voltages Vsig. For example, each of the plurality of current-to-voltage converters 142 may include a current mirror.

The analog-to-digital conversion block 150 includes a plurality of analog-to-digital converters (ADCs) 152. The plurality of analog-to-digital converters 152 convert the plurality of signal voltages Vsig into a plurality of digital signals DS.

Each of the plurality of analog-to-digital converters 152 includes at least one resistive memory element RME including the same or similar resistive material as the resistive element RE included in the crossbar array 110, generates a first voltage (e.g., a first voltage VFS in FIG. 4, such as a full scale voltage over a voltage range) based on a reference voltage Vref and the at least one resistive memory element RME, divides the first voltage to generate at least one divided voltage (e.g., a plurality of divided voltages VD in FIG. 4), compares one of the plurality of signal voltages Vsig with the at least one divided voltage to generate at least one comparison signal (e.g., a plurality of comparison signals CS in FIG. 4), and generates one of the plurality of digital signals DS based on the at least one comparison signal. Detailed configurations and operations of each of the plurality of analog-to-digital converters 152 will be described with reference to FIGS. 4 through 11.

The adder block 160 may include a plurality of adders (ADRs) 162. The plurality of adders 162 may sum the plurality of digital signals DS to generate a plurality of summed digital signals ADS.

The shift register block 170 may include a plurality of shift registers (SRs) 172. The plurality of shift registers 172 may generate final output data DAT based on an output of the plurality of adders 162 (e.g., based on the plurality of summed digital signals ADS). The final output data DAT may correspond to a final result of the multiplication and accumulation operations performed by the neural network system.

In an example of FIG. 1, the number of the plurality of current-to-voltage converters 142, the number of the plurality of analog-to-digital converters 152, the number of the plurality of adders 162 and the number of the plurality of shift registers 172 may be substantially equal to the number of the plurality of columns CL1, CL2, . . . , CLM of the crossbar array 110.

Although not illustrated in FIG. 1, the neuromorphic computing device 100 may further include a timing controller or a control circuit that generates control signals for controlling operation timings of the first switching matrix 120, the second switching matrix 130, the current-to-voltage conversion block 140, the analog-to-digital conversion block 150, the adder block 160, the shift register block 170, etc., and/or may further include a voltage regulator that generates the row driving voltages, the column driving voltages, the reference voltage Vref, etc.

Typically, the plurality of resistive memory cells RMC included in the crossbar array 110 have temperature and time dependency. For example, the resistive element RE included in each of the plurality of resistive memory cells RMC may have a temperature dependency in which a resistance decreases as a temperature increases and the resistance increases as the temperature decreases. In addition, the resistive element RE may have a time dependency including a retention characteristic in which the resistance decreases as time goes on, a drift characteristic in which the resistance increases when a span of time (e.g., a predetermined, suitable, and/or advantageous span of time) elapses after a data write operation, or the like. Thus, the read current Iread output from the crossbar array 110 may be changed depending on temperature and time. To store accurate data and perform computation or calculation without errors, it is necessary to reduce or eliminate such temperature and time dependency.

The neuromorphic computing device 100 according to some example embodiments may include the analog-to-digital converter 152 that includes the at least one resistive memory element RME including the same or similar resistive material as the resistive element RE included in the crossbar array 110. In the neuromorphic computing device 100 according to some example embodiments, the read current Iread output from the crossbar array 110, the signal voltage Vsig corresponding to the read current Iread and the first voltage VFS used in the analog-to-digital converter 152 may have the same or similar temperature and time dependency. Thus, when the output of the crossbar array 110 is analog-to-digital converted, the digital signal DS that does not change (or does not significantly change) depending on temperature and time may be generated without suppressing temperature and time dependency of the resistive element RE included in the crossbar array 110.

An analog-to-digital conversion and the data computation performed by some example embodiments may be performed efficiently and/or without errors, for example, by reducing inconsistency in the digital values generated in response to a fixed analog input (such as a fixed signal voltage) that may result from time-dependent and/or temperature-dependent characteristics of other analog-to-digital conversion processes. In some example embodiments, the consistency achieved by such analog-to-digital conversion may enable devices incorporating the same to reduce or omit other error-detection and/or error-correction mechanisms, such as additional circuitry or verification processes. In some example embodiments, the consistency achieved by such analog-to-digital conversion may enable devices incorporating the same to reduce or omit a redundant storage of data, such as checksum data and/or duplicate or backup copies of the stored data. In some example embodiments, the consistency achieved by such analog-to-digital conversion may enable devices incorporating the same to complete a read operation and/or a write operation in a faster and/or more energy-efficient manner, for example, by reducing or omitting a subsequent verification. The completion of individual operations in a faster or more efficient manner may, in the aggregate, substantially increase the performance (such as speed or power efficiency) of an artificial neural network during such operations as inference, training, validation, and/or prediction in tasks such as classification and regression.

Figure 2A:
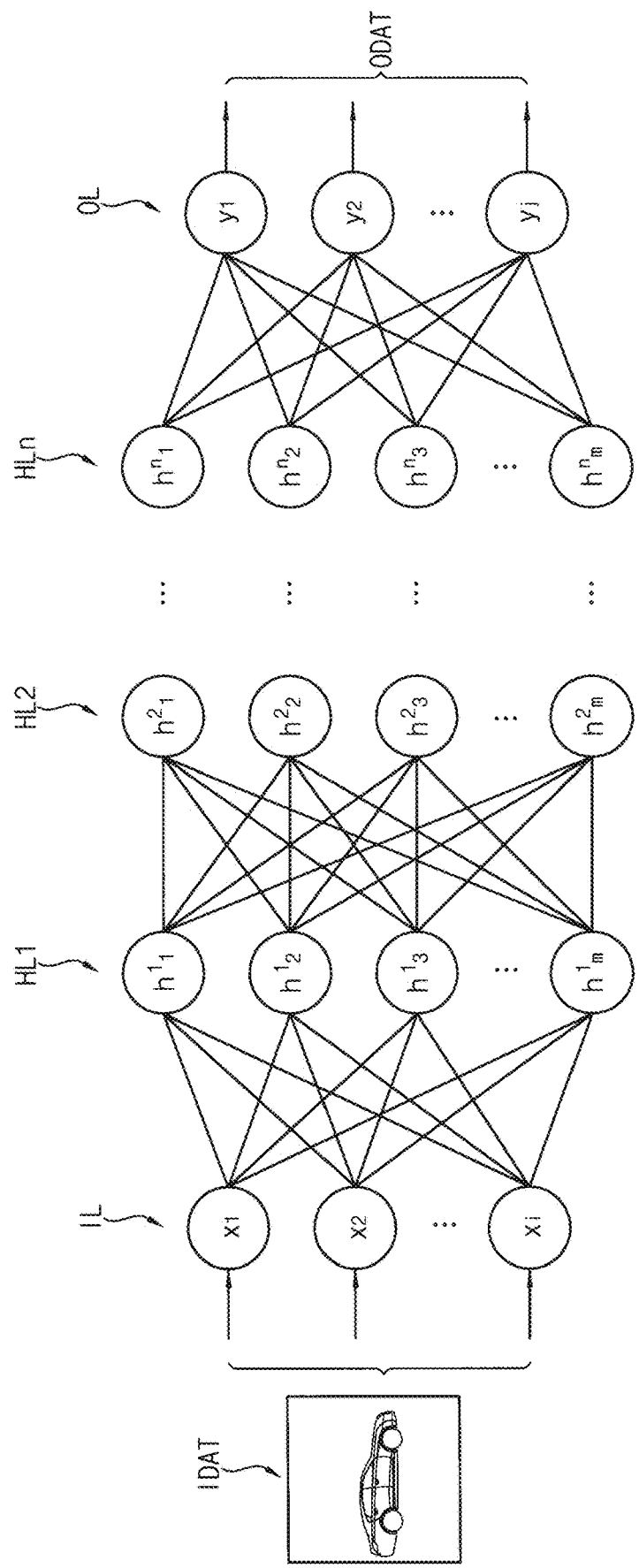
FIGS. 2A and 2B are diagrams for describing an example of a neural network system that is driven by a neuromorphic computing device according to some example embodiments.
Figure 2B:
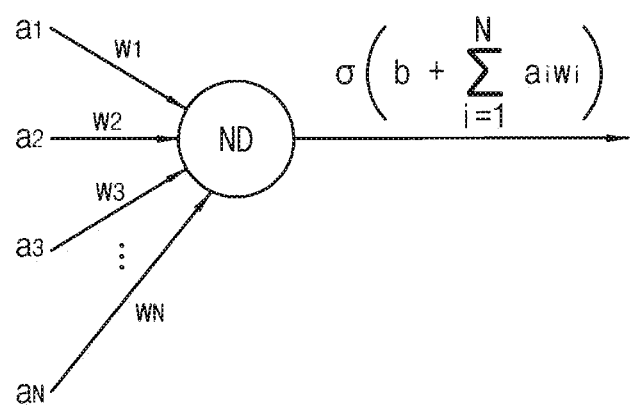

FIGS. 2A and 2B are diagrams for describing an example of a neural network system that is driven by a neuromorphic computing device according to some example embodiments.

Referring to FIG. 2A, a general neural network may include an input layer IL, a plurality of hidden layers HL1, HL2, . . . , HLn, and an output layer OL.

The input layer IL may include i input nodes $x_1$, $x_2$, . . . , $x_i$, where i is a natural number. Input data (e.g., vector input data) IDAT whose length is i may be input to the input nodes $x_1$, $x_2$, . . . , $x_i$ such that each element of the input data IDAT is input to a respective one of the input nodes $x_1$, $x_2$, . . . , $x_i$.

The plurality of hidden layers HL1, HL2, . . . , HLn may include n hidden layers, where n is a natural number, and may include a plurality of hidden nodes $h^1_1, h^1_2, h^1_3, \ldots, h^1_m, h^2_1, h^2_2, h^2_3, \ldots, h^2_m, h''_1, h''_2, h''_3, \ldots, h''_m$. For example, the hidden layer HL1 may include m hidden nodes $h^1_1, h^1_2, h^1_3, \ldots, h^1_m$, the hidden layer HL2 may include m hidden nodes $h^2_1, h^2_2, h^2_3, \ldots, h^2_m$, and the hidden layer HLn may include m hidden nodes $h''_1, h''_2, h''_3, \ldots, h''_m$, where m is a natural number.

The output layer OL may include j output nodes $y_1, y_2, \ldots, y_j$, where j is a natural number. Each of the output nodes $y_1, y_2, \ldots, y_j$ may correspond to a respective one of classes to be categorized. The output layer OL may be configured to generate output values (e.g., class scores or numerical output such as a regression variable) and/or output data ODAT associated with the input data IDAT for each of the classes. In some example embodiments, the output layer OL may be a fully-connected layer and may indicate, for example, a probability that the input data IDAT corresponds to a car.

A structure of the neural network illustrated in FIG. 2A may be represented by information on branches (or connections) between nodes illustrated as lines, and a weighted value assigned to each branch, which is not illustrated. In some neural network models, nodes within one layer may not be connected to one another, but nodes of different layers may be fully or partially connected to one another. In some other neural network models, such as unrestricted Boltzmann machines, at least some nodes within one layer may also be connected to other nodes within one layer in addition to (or alternatively with) one or more nodes of other layers.

Each node (e.g., the node $h^1_1$) may be configured to receive an output of a previous node (e.g., the node $x_1$), may perform a computing operation, computation or calculation on the received output, and may output a result of the computing operation, computation or calculation as an output to a next node (e.g., the node $h^2_1$). Each node may be configured to calculate a value to be output by applying the input to a specific function, e.g., a nonlinear function.

In some example embodiments, the structure of the neural network is set in advance, and the weighted values for the connections between the nodes are set appropriately using data having an already known answer of which class the data belongs to (sometimes referred to as a "label"). The data with the already known answer is sometimes referred to as "training data," and a process of determining the weighted value is sometimes referred to as "training." The neural network "learns" to associate the data with corresponding labels during the training process. A group of an independently trainable structure and the weighted value is sometimes referred to as a "model," and a process of predicting, by the model with the determined weighted value, which class the input data belongs to, and then outputting the predicted value, is sometimes referred to as a "testing" process.

Referring to FIG. 2B, an example of an operation performed by one node ND included in the neural network of FIG. 2A is illustrated in detail.

Based on N inputs $a_1, a_2, a_3, \ldots, a_N$ provided to the node ND, the node ND may be configured to multiply the N inputs $a_1, a_2, a_3, \ldots, a_N$ and corresponding N weights $w_1, w_2, w_3, \ldots, w_N$, respectively, to sums N values obtained by the multiplication, to add an offset "b" to a summed value, and/or to generate one output value (e.g., "z") by applying a value to which the offset "b" is added to a specific function "σ".

In some example embodiments and as shown in FIG. 2B, one layer included in the neural network illustrated in FIG. 2A includes M nodes ND, and output values of the one layer may be obtained by Equation 1.

$$W*A=Z \qquad \text{[Equation 1]}$$

In Equation 1, "W" represents weights for all connections included in the one layer, and may be implemented in an M*N matrix form. "A" represents the N inputs $a_1, a_2, a_3, \ldots, a_N$ received by the one layer, and may be implemented in an N*1 matrix form. "Z" represents M outputs $z_1, z_2, z_3, \ldots, z_M$ output from the one layer, and may be implemented in an M*1 matrix form.

Figure 3A:
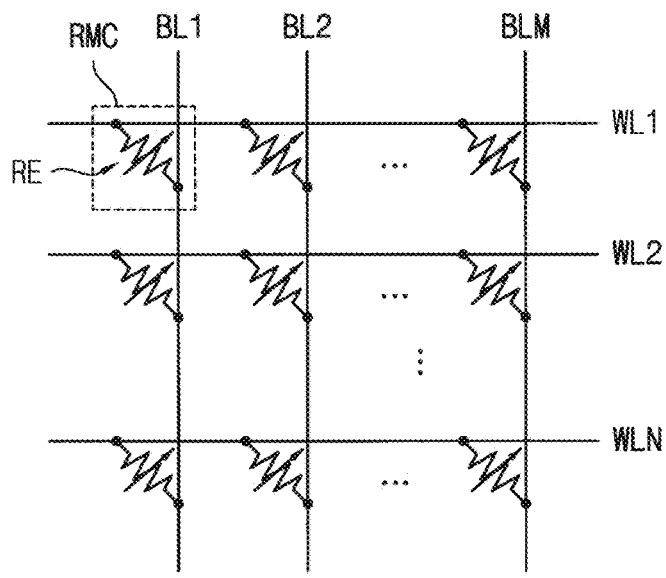
FIGS. 3A, 3B and 3C are diagrams illustrating examples of a crossbar array included in a neuromorphic computing device according to some example embodiments.
Figure 3B:
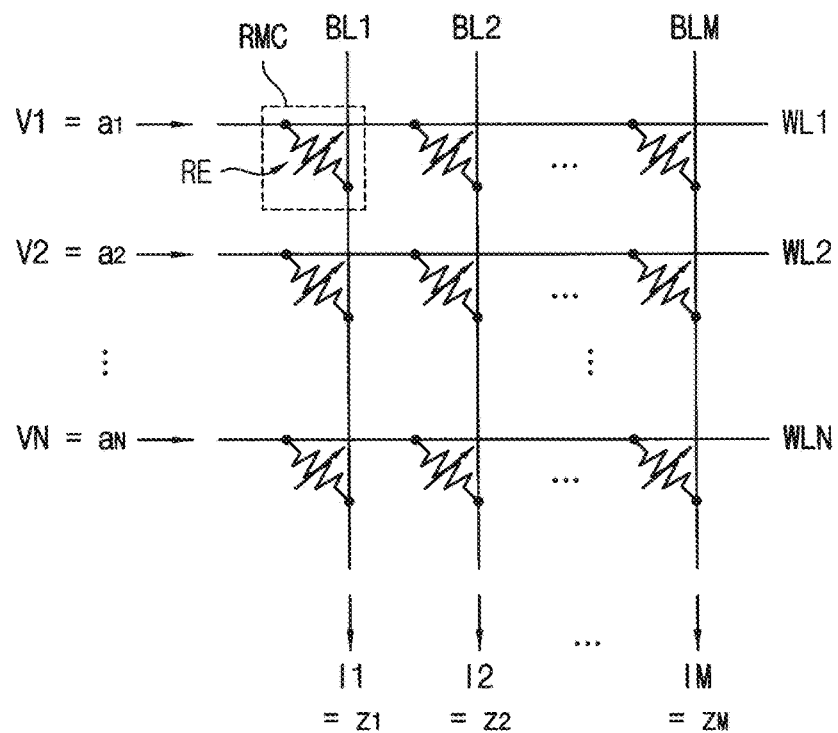
Figure 3C:
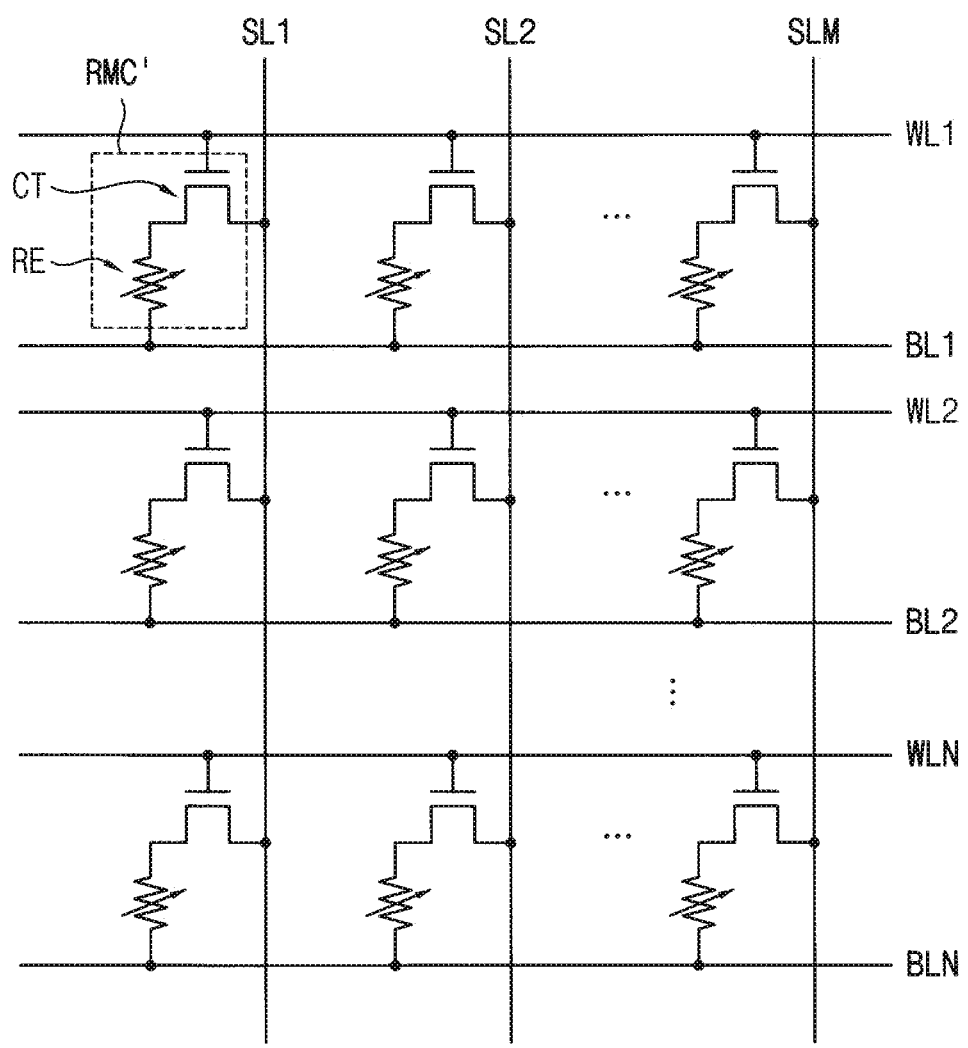

FIGS. 3A, 3B and 3C are diagrams illustrating examples of a crossbar array included in a neuromorphic computing device according to some example embodiments.

Referring to FIG. 3A, a crossbar array 110a includes a plurality of wordlines WL1, WL2, ..., WLN, a plurality of bitlines BL1, BL2, ..., BLM, and a plurality of resistive memory cells RMC.

The plurality of wordlines WL1, WL2, ..., WLN in FIG. 3A may correspond to the plurality of rows RW1, RW2, ..., RWN in FIG. 1, the plurality of bitlines BL1, BL2, ..., BLM in FIG. 3A may correspond to the plurality of columns CL1, CL2, ..., CLM in FIG. 1, and the plurality of resistive memory cells RMC in FIG. 3A may correspond to the plurality of resistive memory cells RMC in FIG. 1. Each of the plurality of resistive memory cells RMC may include a resistive element RE, and may be connected to a respective one of the plurality of wordlines WL1, WL2, ..., WLN and a respective one of the plurality of bitlines BL1, BL2, ..., BLM.

A resistance of the resistive element RE may be changed based on a write voltage applied through the plurality of wordlines WL1, WL2, ..., WLN or the plurality of bitlines BL1, BL2, ..., BLM, and the plurality of resistive memory cells RMC may be configured to store a plurality of data by the resistance change of the resistive element RE. For example, based on the write voltage being applied to a selected wordline and a ground voltage (e.g., about 0V) being applied to a selected bitline, the device may be configured to write data '1' into a selected resistive memory cell. Based on the ground voltage being applied to the selected wordline and the write voltage being applied to the selected bitline, the device may be configured to write data '0' into the selected resistive memory cell. Further, based on a read voltage being applied to the selected wordline and the ground voltage being applied to the selected bitline, the device may be configured to read or retrieve data that was written in the selected resistive memory cell.

In some example embodiments, each of the plurality of resistive memory cells RMC may include one of various resistive memory cells, e.g., a phase change random access memory (PRAM) cell, a resistance random access memory (RRAM) cell, a magnetic random access memory (MRAM) cell, a ferroelectric random access memory (FRAM) cell, or the like.

In some example embodiments, the resistive element RE may include a phase change material that changes its crystalline state depending on an amount of a current. The phase change material may include various materials such as GaSb, InSb, InSe, Sb2Te3, and GeTe in which two elements are combined, GeSbTe, GaSeTe, InSbTe, SnSb2Te4, and InSbGe in which three elements are combined, and AgInSbTe, (GeSn)SbTe, GeSb(SeTe), and Te81Ge15Sb2S2 in which four elements are combined. In some other example embodiments, the resistive element RE may include a perovskite compound, a transition metal oxide, a magnetic material, a ferromagnetic material, or an anti-ferromagnetic material, instead of the phase change material. However, the materials included in the resistive element RE are not limited thereto.

Referring to FIG. 3B, an example embodiment in which the crossbar array 110a of FIG. 3A performs the operation described with reference to FIGS. 2A and 2B is illustrated.

Each resistive memory cell RMC may correspond to one synapse or connection in the neural network system and may store one weight. Thus, M*N data stored in the crossbar array 110a may correspond to a weight matrix that includes the weights included in the one layer described with reference to FIGS. 2A and 2B. In other words, the M*N data may correspond to "W" that is implemented in the M*N matrix form in Equation 1.

N input voltages V1, V2, . . . , VN applied through the plurality of wordlines WL1, WL2, . . . , WLN may correspond to an input matrix that includes the N inputs $a_1$, $a_2$, $a_3$, . . . , $a_N$ received by the one layer described with reference to FIGS. 2A and 2B. In other words, the N input voltages V1, V2, . . . , VN may correspond to "A" that is implemented in the N*1 matrix form in Equation 1.

M read currents I1, I2, . . . , IM output through the plurality of bitlines BL1, BL2, . . . , BLM are M may correspond to an output matrix that includes the M outputs $z_1$, $z_2$, $z_3$, . . . , $z_M$ output from the one layer described with reference to FIGS. 2A and 2B. In other words, the M read currents I1, I2, . . . , IM may correspond to "Z" that is implemented in the M*1 matrix form in Equation 1.

Based on the crossbar array 110a being implemented by storing the plurality of weights having a matrix form in the plurality of resistive memory cells RMC, and based on the input voltages V1, V2, . . . , VN corresponding to the plurality of inputs being provided through the plurality of wordlines WL1, WL2, . . . , WLN, the device may be configured to generate read currents I1, I2, . . . , IM output through the plurality of bitlines BL1, BL2, . . . , BLM that correspond to the result of the multiplication and accumulation operations performed by the neural network system. By implementing the at least one layer in the neural network system in this manner, the neuromorphic computing device may be configured to perform the data storage and computation (or calculation) operations at once.

Referring to FIG. 3C, a crossbar array 110b includes a plurality of wordlines WL1, WL2, . . . , WLN, a plurality of bitlines BL1, BL2, . . . , BLN, a plurality of source lines SL, SL2, . . . , SLM, and a plurality of resistive memory cells RMC'. The descriptions repeated with FIG. 3A will be omitted.

The plurality of wordlines WL1, WL2, . . . , WLN and the plurality of bitlines BL1, BL2, . . . , BLN in FIG. 3C may correspond to the plurality of rows RW1, RW2, . . . , RWN in FIG. 1, the plurality of source lines SL, SL2, . . . , SLM in FIG. 3C may correspond to the plurality of columns CL1, CL2, . . . , CLM in FIG. 1, and the plurality of resistive memory cells RMC' in FIG. 3C may correspond to the plurality of resistive memory cells RMC in FIG. 1.

Each of the plurality of resistive memory cells RMC' may include a cell transistor CT and a resistive element RE, and may be connected to a respective one of the plurality of wordlines WL1, WL2, . . . , WLN, a respective one of the plurality of bitlines BL1, BL2, . . . , BLN and a respective one of the plurality of source lines SL, SL2, . . . , SLM. For example, the cell transistor CT may include a first electrode (such as a drain, source, collector, or emitter) connected to one of the plurality of source lines SL, SL2, . . . , SLM, a third electrode (such as a gate electrode or a base electrode) connected to one of the plurality of wordlines WL1, WL2, . . . , WLN, and a second electrode (such as a source, drain, emitter, or emitter, which may be an opposite of the first electrode). The resistive element RE may be connected between the second electrode of the cell transistor CT and one of the plurality of bitlines BL1, BL2, . . . , BLN.

For example, based on a power supply voltage (e.g., VCC) being applied to a selected wordline, a write voltage being applied to a selected bitline, and a ground voltage being applied to a selected source line, the device may be configured to write data '1' into a selected resistive memory cell. Based on the power supply voltage being applied to the selected wordline, the ground voltage being applied to the selected bitline, the write voltage being applied to the selected source line, the device may be configured to write data '0' into the selected resistive memory cell. Further, based on the power supply voltage being applied to the selected wordline, a read voltage being applied to the selected bitline, and the ground voltage being applied to the selected source line, the device may be configured to read or retrieve data written in the selected resistive memory cell.

Although the crossbar arrays 110a and 110b having a two-dimensional (2D) array structure are illustrated in FIGS. 3A, 3B and 3C, some example embodiments are not limited thereto, and a crossbar array may be included in a three-dimensional (3D) or vertical array structure. In addition, a configuration of the resistive memory cells RMC and RMC' may be changed according to some example embodiments.

Figure 4:
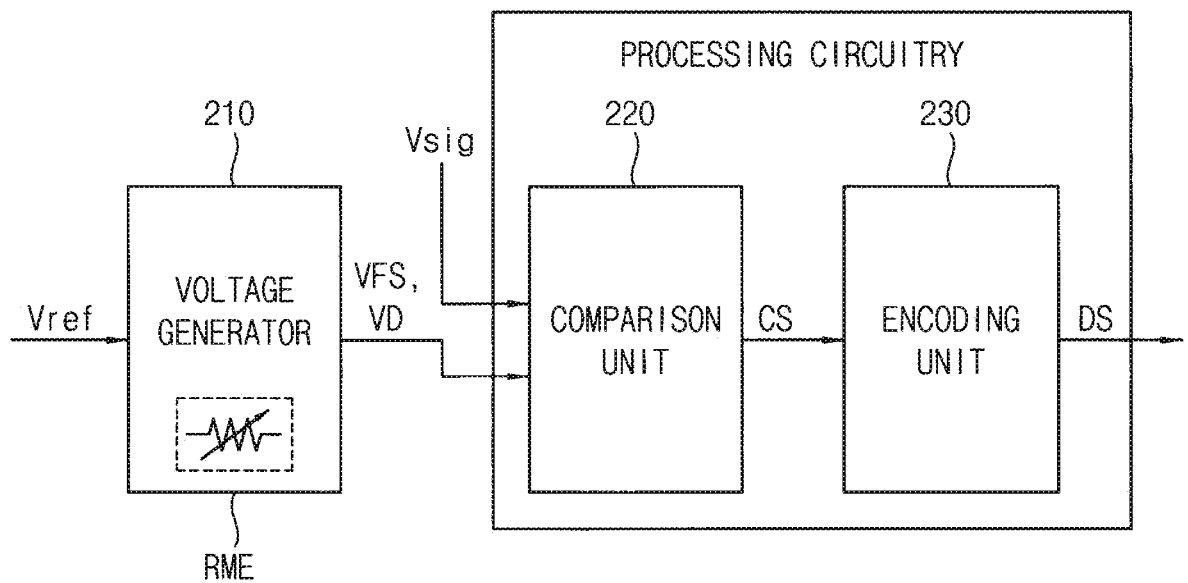
FIG. 4 is a block diagram illustrating an analog-to-digital converter according to some example embodiments.

FIG. 4 is a block diagram illustrating an analog-to-digital converter according to some example embodiments.

Referring to FIG. 4, an analog-to-digital converter 200 includes a voltage generator 210 and processing circuitry. In the example embodiment shown in FIG. 4, the processing circuitry is shown as a comparison unit 220 and an encoding unit 230, but the processing circuitry may be organized in a different manner in some other example embodiments. The analog-to-digital converter 200 is the analog-to-digital converter 152 included in the neuromorphic computing device 100 of FIG. 1, and is connected to the crossbar array 110 including the plurality of resistive memory cells RMC each of which includes the resistive element RE.

The voltage generator 210 includes at least one resistive memory element RME including the same or similar resistive material as the resistive element RE included in the crossbar array 110, generates a first voltage VFS based on a reference voltage Vref and the at least one resistive memory element RME, and divides the first voltage VFS to generate at least one divided voltage VD. The reference voltage Vref may be a voltage independent with respect to temperature and time (e.g., may have characteristic of temperature and time independency). The first voltage VFS may be generated using the at least one resistive memory element RME, and thus may have temperature and time dependency.

In some example embodiments, as will be described with reference to FIG. 5, the voltage generator 210 may be implemented in the form of a current mirror.

In the example embodiment shown in FIG. 1, the comparison unit 220 compares a signal voltage Vsig from the crossbar array 110 with the plurality of divided voltages VD to generate a plurality of comparison signals CS. As described with reference to FIG. 1, the signal voltage Vsig may be obtained by performing the current-to-voltage conversion on the read current Iread output from one column of the crossbar array 110, and may have temperature and time dependency due to the resistive element RE included in the crossbar array 110.

The encoding unit 230 generates at least one digital signal DS corresponding to the signal voltage Vsig based on the plurality of comparison signals CS. As will be described with reference to FIGS. 5 and 11, configurations of the voltage generator 210, the comparison unit 220 and the encoding unit 230 may be changed according to the number of bits of the digital signal DS.

The analog-to-digital converter 200 according to some example embodiments may include the at least one resistive memory element RME including the same or similar resistive material as the resistive element RE included in the crossbar array 110. Thus, the read current Iread output from the crossbar array 110, the signal voltage Vsig corresponding to the read current Iread and the first voltage VFS generated and used in the analog-to-digital converter 200 may have the same or similar temperature and time dependency, and the digital signal DS that does not change (or does not significantly change) depending on temperature and time may be generated when the output of the crossbar array 110 is analog-to-digital converted. Accordingly, the analog-to-digital conversion may be efficiently performed without errors.

In some example embodiments, the processing circuitry that performs the comparing and the generating of the digital signal may include hardware such as logic circuits; a hardware/software combination, such as a processor executing software; or a combination thereof. For example, a processor may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. Additionally, in some example embodiments, the organization of the processing circuitry may vary as compared with some other example embodiments, such as the example embodiment shown in FIG. 4. In other example embodiments, the processing circuitry may include a different organization of components, such as renaming, rearranging, adding, partitioning, duplicating, merging, and/or removing components, sets of components, and relationships thereamong, without departing from the scope of the present disclosure. All such variations that are reasonably technically and logically possible, and that are not contradictory with other statements, are intended to be included in this disclosure, the scope of which is to be understood as being limited only by the claims.

Figure 5:
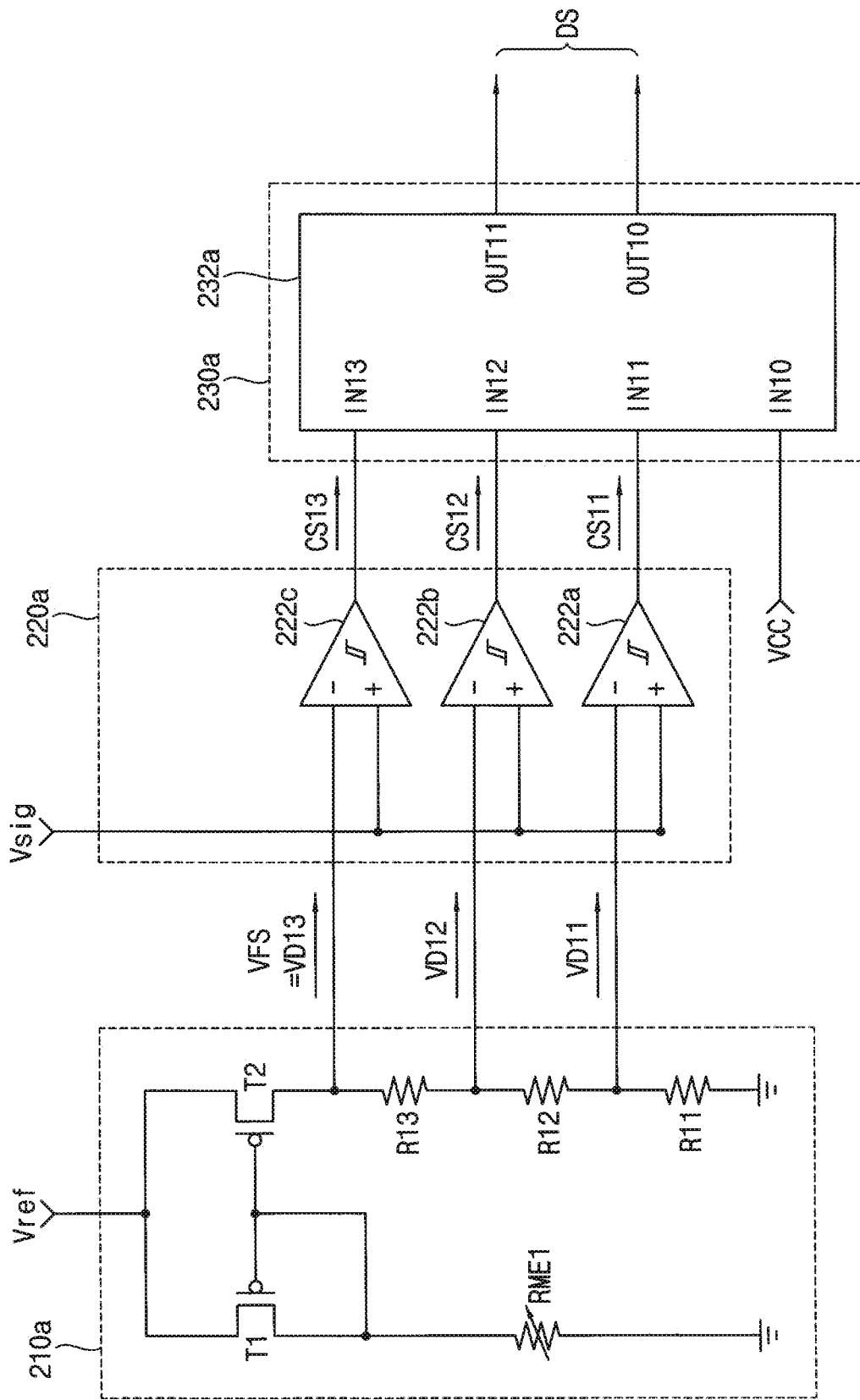
FIG. 5 is a circuit diagram illustrating an example of the analog-to-digital converter of FIG. 4.

FIG. 5 is a circuit diagram illustrating an example of the analog-to-digital converter of FIG. 4.

Referring to FIG. 5, an analog-to-digital converter 200a includes a voltage generator 210a, a comparison unit 220a and an encoding unit 230a. The analog-to-digital converter 200a of FIG. 5 may be a 2-bit flash analog-to-digital converter that generates a 2-bit digital signal DS.

The voltage generator 210a may include a first transistor T1, a second transistor T2, a first resistive memory element RME1 and a plurality of resistors R11, R12 and R13.

The first transistor T1 may include a first electrode (such as a drain, source, collector, or emitter) receiving the reference voltage Vref, a second electrode (such as a gate or base), and a third electrode (such as a source, drain, emitter, or collector) connected to each other. The second transistor T2 may include a first electrode receiving the reference voltage Vref, a third electrode connected to the third electrode of the first transistor T1, and a second electrode outputting the first voltage VFS. The first resistive memory element RME1 may be connected between the second electrode of the first transistor T1 and a ground voltage, and may include the same or similar resistive material as the resistive element RE included in the crossbar array 110. The plurality of resistors R11, R12 and R13 may be connected in series between the second electrode of the second transistor T2 and the ground voltage. Each of the plurality of resistors R11, R12 and R13 may have a fixed resistance.

As will be described with reference to FIGS. 6A and 6B, the voltage generator 210a may be implemented in the form of a current mirror, and may generate the first voltage VFS, which may have the same or similar temperature and time dependency as the resistive element RE included in crossbar array 110, using the reference voltage Vref independent of temperature and time, the first resistive memory element RME1 and the current mirror structure.

In addition, the voltage generator 210a may be configured to generate a plurality of divided voltages VD11, VD12 and VD13 by dividing the first voltage VFS using the plurality of resistors R11, R12 and R13. In some example embodiments, the number of the plurality of resistors R11, R12 and R13 may be substantially equal to the number of the plurality of divided voltages VD11, VD12 and VD13, while in some other example embodiments, the number of the plurality of resistors may vary from the number of the plurality of divided voltages. The divided voltage VD13 having the highest level among the plurality of divided voltages VD11, VD12 and VD13 may have the same or similar level as the first voltage VFS.

In some example embodiments, the processing circuitry (such as a comparison unit 220a) may include a plurality of comparators 222a, 222b and 222c that are configured to generate a plurality of comparison signals CS11, CS12 and CS13.

In some example embodiments, the processing circuitry (such as a comparator 222a) may be configured to compare the signal voltage Vsig from the crossbar array 110 with the divided voltage VD11 to generate the comparison signal CS11. The comparator 222b may be configured to compare the signal voltage Vsig with the divided voltage VD12 to generate the comparison signal CS12. The comparator 222c may be configured to compare the signal voltage Vsig with the divided voltage VD13 to generate the comparison signal CS13. Each of the plurality of comparison signals CS11, CS12 and CS13 may have a value of '0' or '1'. In some example embodiments, the signal voltage Vsig may be compared with the plurality of divided voltages VD11, VD12 and VD13 by the plurality of comparators 222a, 222b and 222c to be divided into '0' or '1'.

In some example embodiments, the processing circuitry (such as an encoding unit 230a) may include a priority encoder 232a that is configured to convert the plurality of comparison signals CS11, CS12 and CS13 into binary values to generate the digital signal DS.

The priority encoder 232a may include a first input terminal IN10 receiving a power supply voltage VCC, a second input terminal IN11 receiving the comparison signal CS11, a third input terminal IN12 receiving the comparison signal CS12, a fourth input terminal IN13 receiving the comparison signal CS13, a first output terminal OUT10 outputting a first bit of the digital signal DS, and a second output terminal OUT11 outputting a second bit of the digital signal DS.

In some example embodiments, based on the number of bits of the digital signal DS being X, where X is a natural number greater than or equal to two, the number of the plurality of comparators 222a, 222b and 222c included in the comparison unit 220a, the number of the plurality of comparison signals CS11, CS12 and CS13 generated from the comparison unit 220a, and/or the number of resistors R11, R12 and R13 included in the voltage generator 210a may be $(2^X-1)$. In an example of FIG. 5, X=2.

Figure 6A:
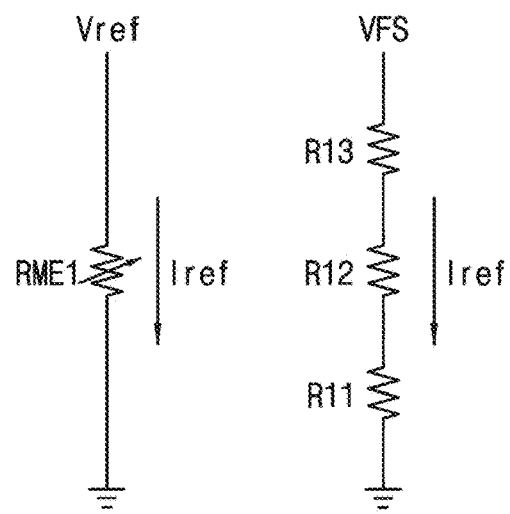
FIGS. 6A, 6B and 6C are diagrams for describing implementation of a voltage generator included in the analog-to-digital converter of FIG. 5.
Figure 6B:
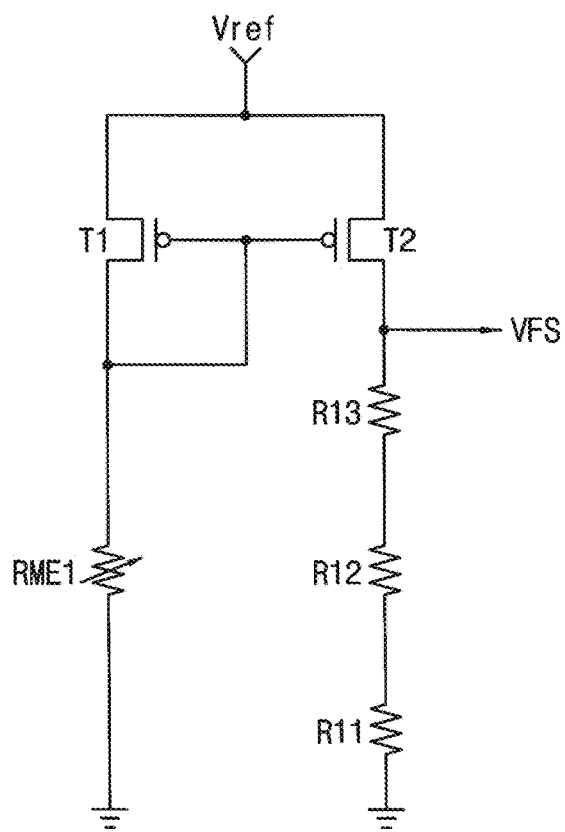
Figure 6C:
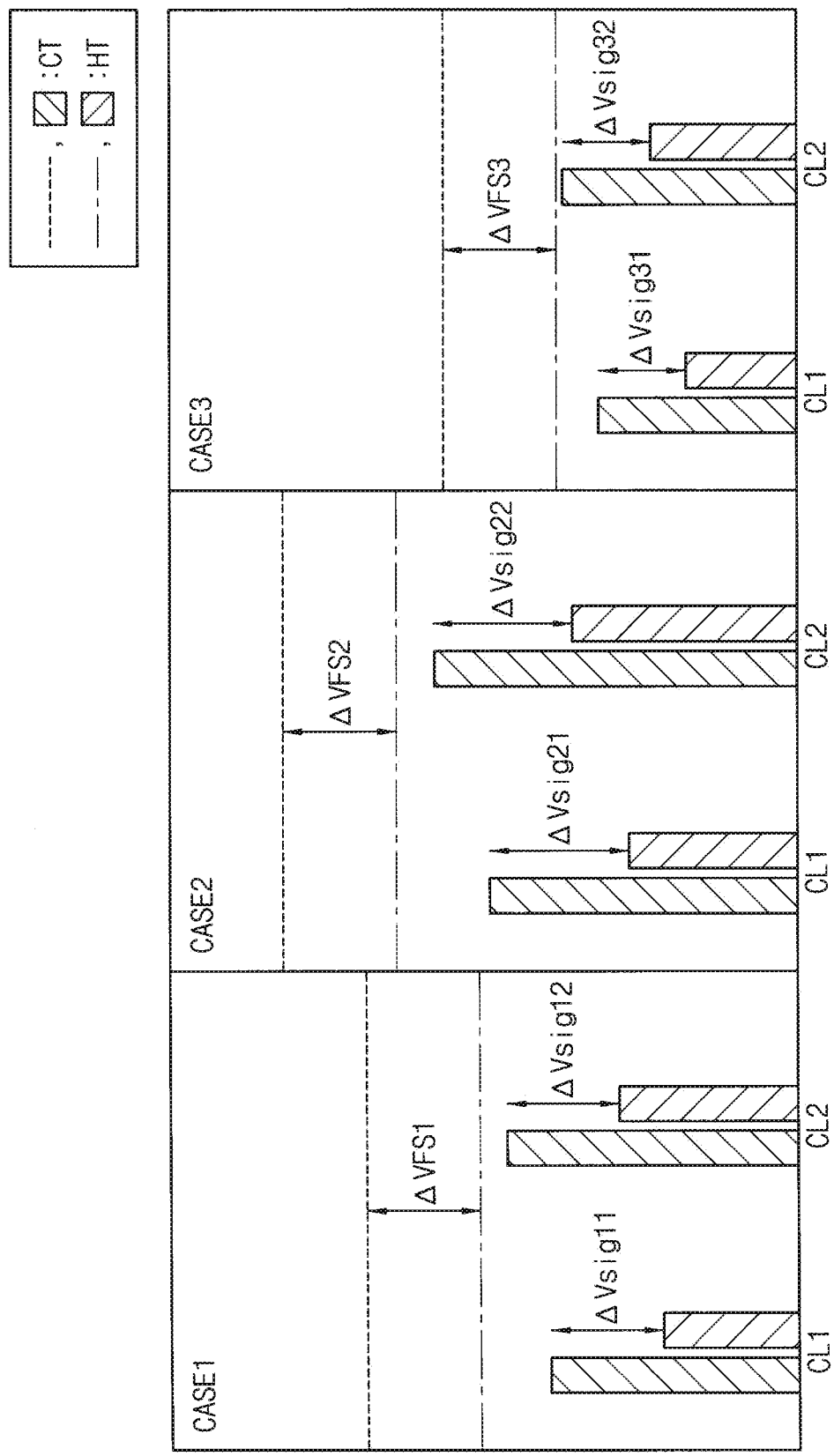

FIGS. 6A, 6B and 6C are diagrams for describing implementation of a voltage generator included in the analog-to-digital converter of FIG. 5.

Referring to FIG. 6A, in some example embodiments, a device is configured to generate a reference current Iref, which may have temperature and/or time dependency using the reference voltage Vref independent of temperature and time and the first resistive memory element RME1, and to generate the first voltage VFS having temperature and time dependency using the reference current Iref. The reference current Iref may be represented by Equation 2.

$$Iref = g * Vref * Temp(T) * Time(t) \qquad \text{[Equation 2]}$$

In Equation 2, "g" represents a conductance of the first resistive memory element RME1, and Temp(T) and Time(t) represent functions of temperature dependency and time dependency of the first resistive memory element RME1, respectively.

Referring to FIG. 6B, to generate the first voltage VFS using the reference current Iref, a current mirror structure that duplicates the reference current Iref may be employed. Thus, the first voltage VFS having temperature and/or time dependency may be generated based on the reference current Iref.

Referring to FIG. 6C, CASE1 represents a voltage change according to temperature in an early state, CASE2 represents a drift characteristic and a voltage change according to temperature, and CASE3 represents a retention characteristic and a voltage change according to temperature. In FIG. 6C, dotted lines represent a change of the first voltage VFS according to temperature, bar graphs represent a change of the signal voltages Vsig output from the columns CL1 and CL2 according to the temperature, CT represents the first voltage VFS and the signal voltage Vsig at relatively cold temperature, and HT represents the first voltage VFS and the signal voltage Vsig at relatively hot temperature.

To hide and/or compensate for the temperature and/or time dependency of the plurality of resistive memory cells RMC and the resistive element RE included in the crossbar array 110 (e.g., to reduce effects of the temperature and/or time dependency), it may be advantageous to implement the device such that the first voltage VFS and the signal voltage Vsig have the same or similar temperature and time dependency for all or at least some cases, as illustrated in FIG. 6C.

In other words, a ratio of the change amount of the signal voltage Vsig according to temperature and a ratio of the change amount of the first voltage VFS according to temperature may be substantially the same for all cases in FIG. 6C (e.g., $\Delta Vsig/Vsig = \Delta VFS/VFS$). For example, a ratio (e.g., $\Delta VFS1/VFS1$) of the change amount of a first voltage VFS1 according to temperature, a ratio (e.g., $\Delta Vsig11/Vsig11$) of the change amount of a signal voltage Vsig11 from the first column CL1 according to temperature, and a ratio (e.g., $\Delta Vsig12/Vsig12$) of the change amount of a signal voltage Vsig12 from the second column CL2 according to temperature may be substantially the same as each other in CASE1. Similarly, a ratio (e.g., $\Delta VFS2/VFS2$) of the change amount of a first voltage VFS2 according to temperature, a ratio (e.g., $\Delta Vsig21/Vsig21$) of the change amount of a signal voltage Vsig21 from the first column CL1 according to temperature, and a ratio (e.g., $\Delta Vsig22/Vsig22$) of the change amount of a signal voltage Vsig22 from the second column CL2 according to temperature may be substantially the same as each other in CASE2. A ratio (e.g., $\Delta VFS3/VFS3$) of the change amount of a first voltage VFS3 according to temperature, a ratio (e.g., $\Delta Vsig31/Vsig31$) of the change amount of a signal voltage Vsig31 from the first column CL1 according to temperature, and a ratio (e.g., $\Delta Vsig32/Vsig32$) of the change amount of a signal voltage Vsig32 from the second column CL2 according to temperature may be substantially the same as each other in CASE3.

As described above, the signal voltage Vsig from the crossbar array 110 and the first voltage VFS generated and used in the analog-to-digital converter 200 may be implemented to have the same or similar temperature and time dependency. Thus, the digital signal DS that does not change (or does not significantly change) depending on temperature and time may be generated when the output of the crossbar array 110 is analog-to-digital converted.

FIGS. 7, 8, 9 and 10 are circuit diagrams illustrating other examples of the voltage generator included in the analog-to-digital converter of FIG. 5. The descriptions repeated with FIG. 5 will be omitted.

Figure 7:
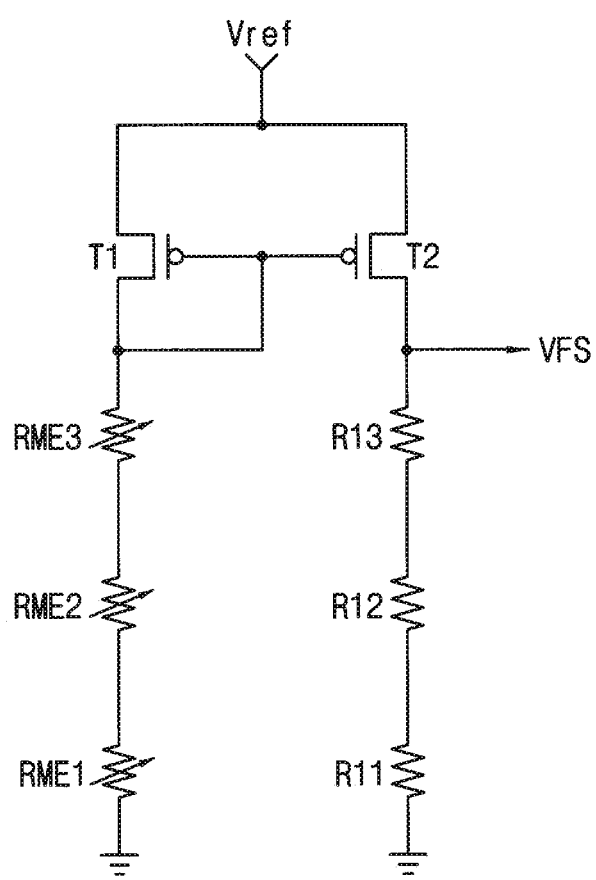
FIGS. 7, 8, 9 and 10 are circuit diagrams illustrating other examples of the voltage generator included in the analog-to-digital converter of FIG. 5.

Referring to FIG. 7, a voltage generator 210b may include a first transistor T1, a second transistor T2, a plurality of resistive memory elements RME1, RME2 and RME3 and a plurality of resistors R11, R12 and R13.

The voltage generator 210b of FIG. 7 may be substantially the same as the voltage generator 210a in FIG. 5, except that the one resistive memory element RME1 in FIG. 5 is changed into the plurality of resistive memory elements RME1, RME2 and RME3 in FIG. 7.

The plurality of resistive memory elements RME1, RME2 and RME3 may be connected in series between the second electrode of the first transistor T1 and the ground voltage. Each of the plurality of resistive memory elements RME1, RME2 and RME3 may include the same or similar resistive material as the resistive element RE included in the crossbar array 110.

As with the plurality of resistive memory cells RMC included in the crossbar array 110, based on the resistive memory element RME included in the analog-to-digital converter 200 being read based on a voltage higher than or equal to a voltage level (e.g., when the voltage higher than or equal to a predetermined level is applied to the resistive memory element RME), the device may be configured to write data into the resistive memory element RME. In some cases, the first voltage VFS may be higher than an allowable read voltage for the resistive memory element RME depending on implementation of the analog-to-digital converter 200, and/or a resistance of the resistive memory element RME may be changed by the first voltage VFS in operation of the analog-to-digital converter 200. In some example embodiments, to prevent or reduce such a resistance change, the plurality of resistive memory elements RME1, RME2 and RME3 may be connected in series, and/or the number of the plurality of resistive memory elements RME1, RME2 and RME3 may be adjusted when designing a chip to operate with a read voltage that meets or satisfies product reliability standards. In addition, devices in which the plurality of resistive memory elements RME1, RME2 and RME3 are connected in series may exhibit an effect of reducing the influence of a manufacturing process distribution.

In some example embodiments, the number of the plurality of resistive memory elements RME1, RME2 and RME3 may be based on the reference voltage Vref and a read voltage for reading the plurality of resistive memory cells RMC included in the crossbar array 110 (e.g., the read voltage for reading the plurality of resistive memory elements RME1, RME2 and RME3). For example, the number of the plurality of resistive memory elements RME1, RME2 and RME3 may be obtained by Equation 3.

$$Y = Vref/Vread \quad \text{[Equation 3]}$$

In Equation 3, "Y" represents the number of the plurality of resistive memory elements RME1, RME2 and RME3, where Y is a natural number greater than or equal to two, and Vread represents the read voltage. If Vref/Vread is not a natural number, Y may be any natural number greater than Vref/Vread.

Figure 8:
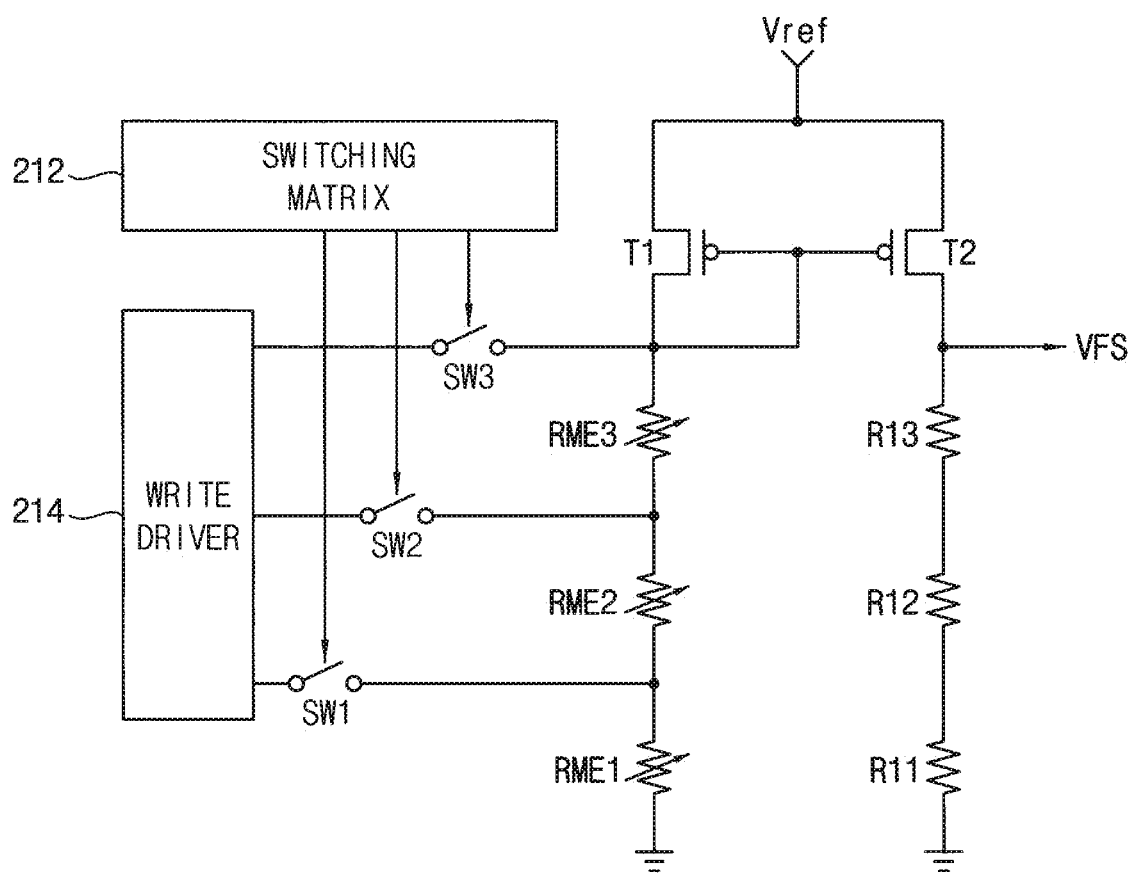

Referring to FIG. 8, a voltage generator 210c may include a first transistor T1, a second transistor T2, a plurality of resistive memory elements RME1, RME2 and RME3, a plurality of resistors R11, R12 and R13, a switching matrix 212, a write driver 214 and a plurality of switching elements SW1, SW2 and SW3.

The voltage generator 210c of FIG. 8 may be substantially the same as the voltage generator 210b of FIG. 7, except that the voltage generator 210c of FIG. 8 further includes the switching matrix 212, the write driver 214 and the plurality of switching elements SW1, SW2 and SW3.

The write driver 214 may be connected to the plurality of resistive memory elements RME1, RME2 and RME3, and may perform a write operation to set each of the plurality of resistive memory elements RME1, RME2 and RME3 to (at least approximately) a target resistance. In other words, the write driver 214 may be configured to set each of the plurality of resistive memory elements RME1, RME2 and RME3 to a resistance state (such as a predetermined, desired, and/or advantageous resistance state). Although not illustrated in FIG. 8, the write driver 214 may be configured to receive a write voltage for the write operation from an external voltage regulator.

The plurality of switching elements SW1, SW2 and SW3 may be between the write driver 214 and the plurality of resistive memory elements RME1, RME2 and RME3. The switching matrix 212 may be configured to control the plurality of switching elements SW1, SW2 and SW3 to select a target resistive memory element on which the write operation is to be performed among the plurality of resistive memory elements RME1, RME2 and RME3. Although not illustrated in FIG. 8, the switching matrix 212 may be configured to receive a selection signal for selecting the target resistive memory element from an external timing controller or control circuit.

In some example embodiments, the write driver 214 may be configured to perform the write operation based on an update of the plurality of data stored in the plurality of resistive memory cells RMC included in the crossbar array 110. In other words, the write driver 214 may be configured to perform the write operation based on an update of the plurality of weights included in the neural network system. Configuring the device to perform the write operation on the plurality of resistive memory elements RME1, RME2 and RME3 simultaneously and/or concurrently with writing the plurality of data into the crossbar array 110 may further reduce a time dependency of the resistive memory elements.

In some example embodiments, the write driver 214 may be configured to perform the write operation to set the plurality of resistive memory elements RME1, RME2 and RME3 to different resistances relative to one another. Based on some resistances being selected according to distribution of the plurality of data stored in the crossbar array 110, and based on the write operation being performed on the plurality of resistive memory elements RME1, RME2 and RME3 connected in series to set different resistances relative to one another in each stage, temperature and time dependency that vary according to initial resistances of the plurality of resistive memory elements RME1, RME2 and RME3 may be averaged, and thus the temperature and time dependency may be further suppressed.

In some example embodiments, the write driver 214 may be configured to perform the write operation to set at least one of the plurality of resistive memory elements RME1, RME2 and RME3 to a maximum resistance.

Figure 9:
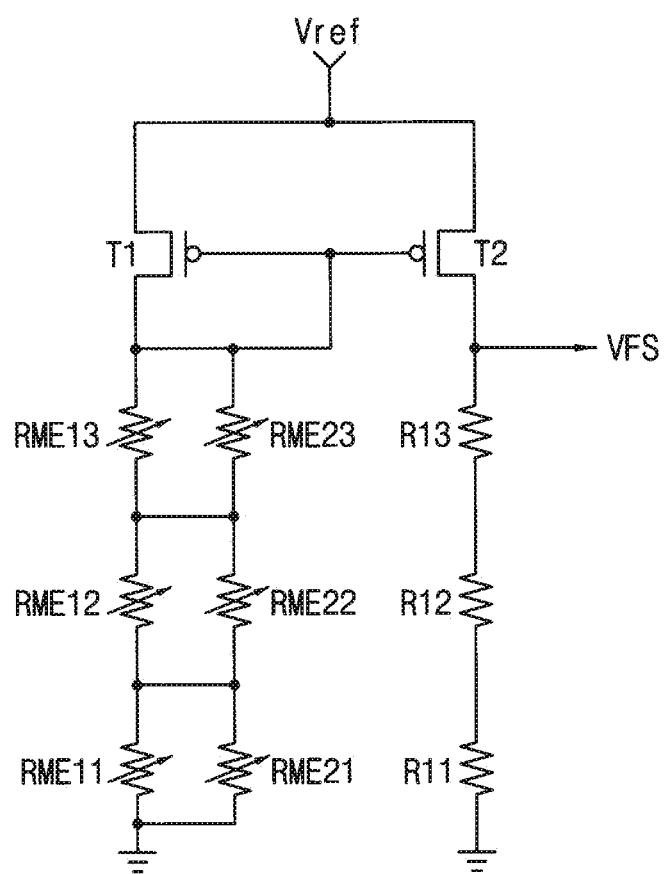

Referring to FIG. 9, a voltage generator 210d may include a first transistor T1, a second transistor T2, a plurality of resistive memory elements RME11, RME12, RME13, RME21, RME22 and RME23 and a plurality of resistors R11, R12 and R13.

The voltage generator 210d of FIG. 9 may be substantially the same as the voltage generator 210b of FIG. 7, except that the plurality of resistive memory elements RME1, RME2 and RME3 in FIG. 7 are changed into the plurality of resistive memory elements RME11, RME12, RME13, RME21, RME22 and RME23 in FIG. 9.

The plurality of resistive memory elements RME11, RME12, RME13, RME21, RME22 and RME23 may include a first group of resistive memory elements RME11, RME12 and RME13 and a second group of resistive memory elements RME21, RME22 and RME23. The first group of resistive memory elements RME11, RME12 and RME13 may be connected in series between the second electrode of the first transistor T1 and the ground voltage. The second group of resistive memory elements RME21, RME22 and RME23 may be connected in series between the second electrode of the first transistor T1 and the ground voltage. The second group of resistive memory elements RME21, RME22 and RME23 and the first group of resistive memory elements RME11, RME12 and RME13 may be connected in parallel to each other. In addition, each of the second group of resistive memory elements RME21, RME22 and RME23 and a respective one of the first group of resistive memory elements RME11, RME12 and RME13 may be connected in parallel to each other.

Example embodiments in which the plurality of resistive memory elements RME11, RME12, RME13, RME21, RME22 and RME23 are connected in series, and in which each stage includes two or more resistive memory elements connected in parallel, may exhibit an effect of more reducing the influence of manufacturing process distribution.

Figure 10:
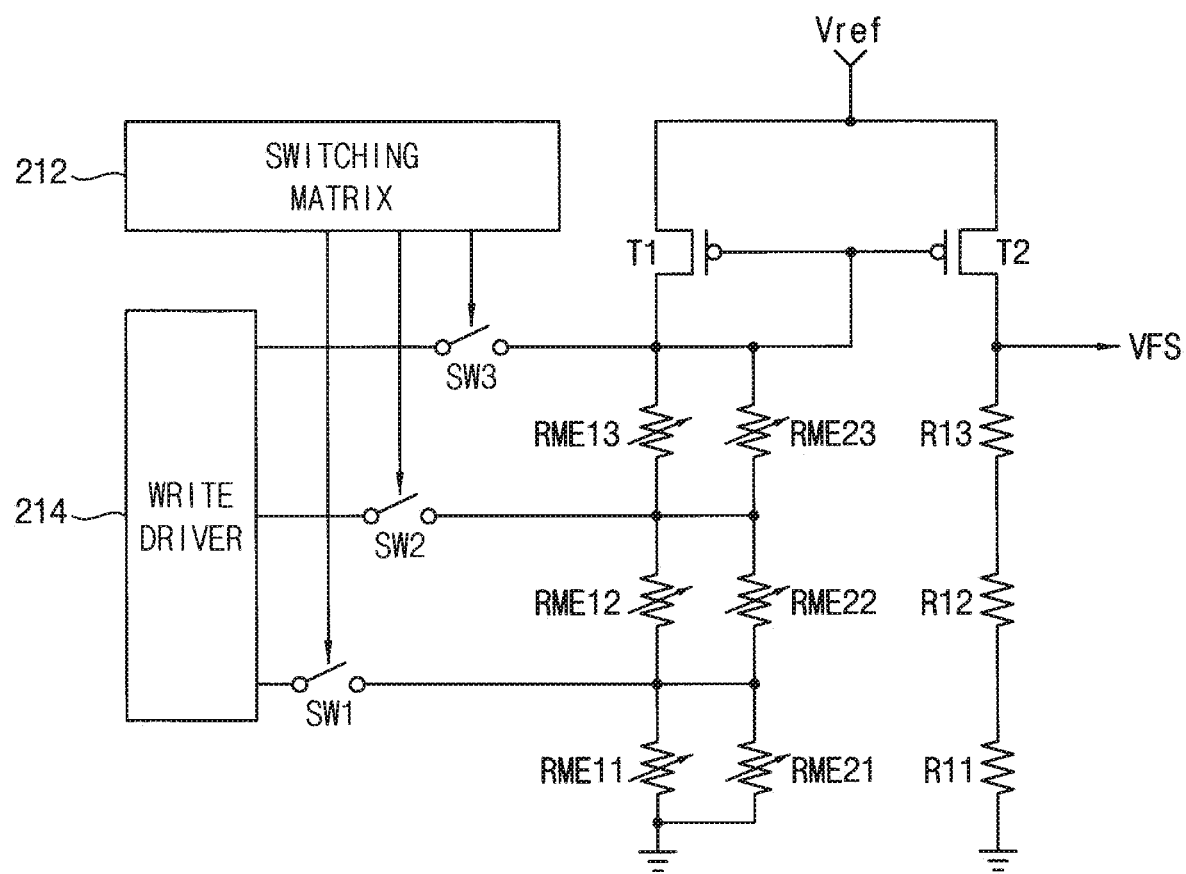

Referring to FIG. 10, a voltage generator 210e may include a first transistor T1, a second transistor T2, a plurality of resistive memory elements RME11, RME12, RME13, RME21, RME22 and RME23, a plurality of resistors R11, R12 and R13, a switching matrix 212, a write driver 214 and a plurality of switching elements SW1, SW2 and SW3.

The voltage generator 210e of FIG. 10 may be substantially the same as the voltage generator 210c of FIG. 8, except that the plurality of resistive memory elements RME1, RME2 and RME3 in FIG. 8 are changed into the plurality of resistive memory elements RME11, RME12, RME13, RME21, RME22 and RME23 in FIG. 10.

The write driver 214 may be connected to the plurality of resistive memory elements RME11, RME12, RME13, RME21, RME22 and RME23, and may be configured to perform a write operation to set each of the plurality of resistive memory elements RME11, RME12, RME13, RME21, RME22 and RME23 to a target resistance. The plurality of switching elements SW1, SW2 and SW3 may be between the write driver 214 and the plurality of resistive memory elements RME11, RME12, RME13, RME21, RME22 and RME23. The switching matrix 212 may be configured to select a target resistive memory element on which the write operation is to be performed among the plurality of resistive memory elements RME11, RME12, RME13, RME21, RME22 and RME23.

In some example embodiments, the write driver 214 may be configured to perform the write operation to set the first group of resistive memory elements RME11, RME12 and RME13 have different resistances relative to one another and to set the second group of resistive memory elements RME21, RME22 and RME23 to different resistances relative to one another. Further, the write driver 214 may be configured to perform the write operation to set each of the first group of resistive memory elements RME11, RME12 and RME13 and a respective one of the second group of resistive memory elements RME21, RME22 and RME23 that are connected in parallel to each other to the same or similar resistance relative to one another.

For example, the resistive memory elements RME11, RME12 and RME13 may have different resistances relative to one another, and the resistive memory elements RME21, RME22 and RME23 may have different resistances relative to one another. Further, the resistive memory elements RME11 and RME21 connected in parallel in the same stage may have the same or similar resistance relative to each other, the resistive memory elements RME12 and RME22 connected in parallel in the same stage may have the same or similar resistance relative to each other, and the resistive memory elements RME13 and RME23 connected in parallel in the same stage may have the same or similar resistance relative to each other. For example, the resistive memory elements RME11 and RME21 may have a first resistance that is relatively small, the resistive memory elements RME12 and RME22 may have a second resistance that is greater than the first resistance, and the resistive memory elements RME13 and RME23 may have a third resistance that is greater than the second resistance. As such, temperature and time dependency that vary according to initial resistances of the plurality of resistive memory elements RME11, RME12, RME13, RME21, RME22 and RME23 may be averaged, and thus the temperature and time dependency may be further suppressed.

Although the voltage generators 210b, 210c, 210d and 210e including the specific number of resistive memory elements and the specific number of groups of resistive memory elements are illustrated in FIGS. 7, 8, 9 and 10, some example embodiments are not limited thereto, and the number of resistive memory elements and/or the number of groups of resistive memory elements may be changed according to some example embodiments.

Figure 11:
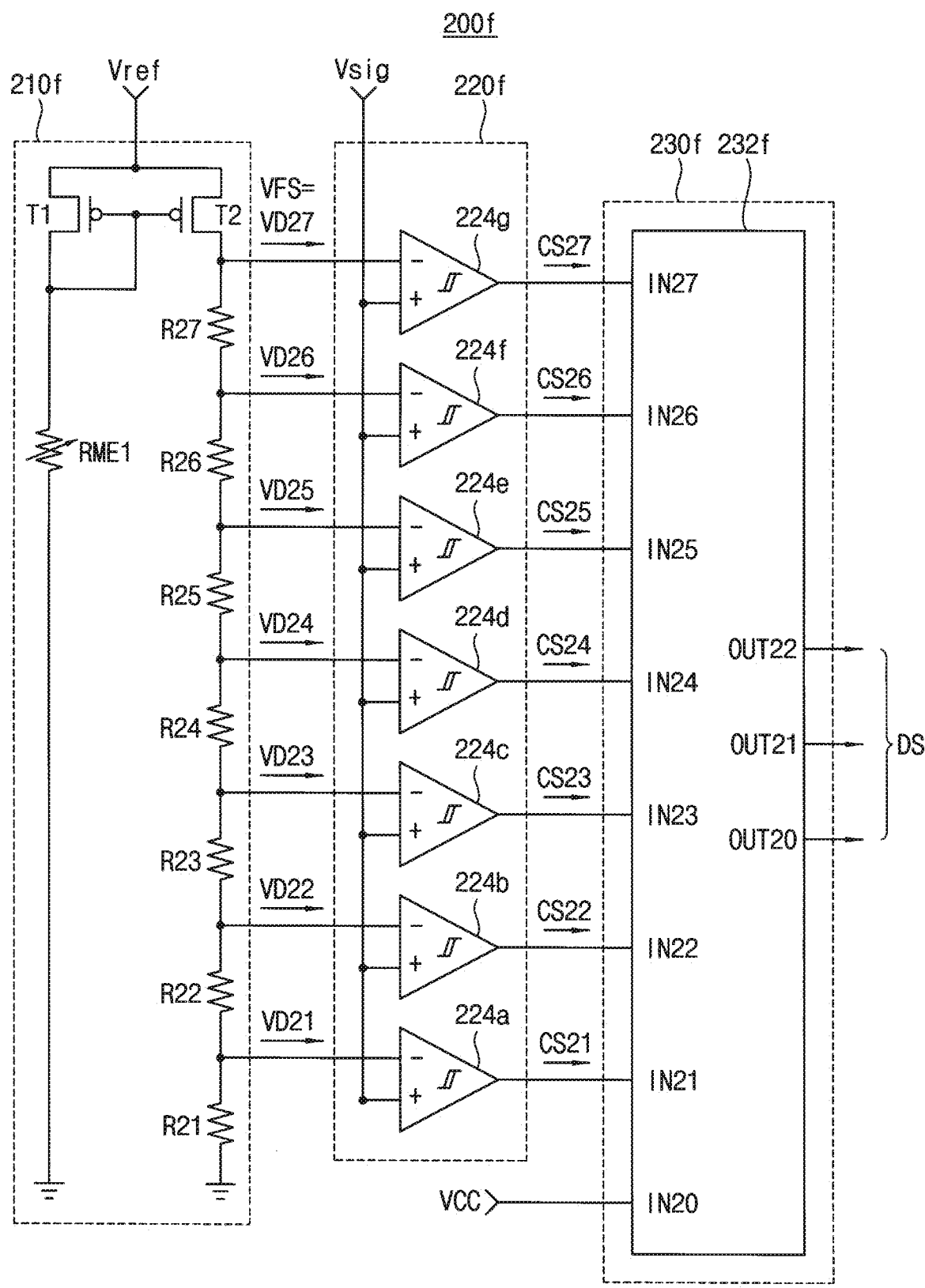
FIG. 11 is a circuit diagram illustrating another example of the analog-to-digital converter of FIG. 4.

FIG. 11 is a circuit diagram illustrating another example of the analog-to-digital converter of FIG. 4. The descriptions repeated with FIG. 5 will be omitted.

Referring to FIG. 11, an analog-to-digital converter 200f includes a voltage generator 210f, a comparison unit 220f and an encoding unit 230f. In some example embodiments, the analog-to-digital converter 200f of FIG. 11 may be a 3-bit flash analog-to-digital converter that generates a 3-bit digital signal DS.

The voltage generator 210f may include a first transistor T1, a second transistor T2, a first resistive memory element RME1 and a plurality of resistors R21, R22, R23, R24, R25, R26 and R27. The voltage generator 210f in FIG. 11 may be substantially the same as the voltage generator 210a in FIG. 5, except that the number of the plurality of resistors R21, R22, R23, R24, R25, R26 and R27 is changed. In some example embodiments, the number of the plurality of resistors R21, R22, R23, R24, R25, R26 and R27 may be substantially equal to the number of a plurality of divided voltages VD21, VD22, VD23, VD24, VD25, VD26 and VD27 generated by the voltage generator 210f. In some example embodiments, a configuration of the voltage generator 210f may be changed as described with reference to FIGS. 7, 8, 9 and 10.

The comparison unit 220f may include a plurality of comparators 224a, 224b, 224c, 224d, 224e, 224f and 224g that are configured to generate a plurality of comparison signals CS21, CS22, CS23, CS24, CS25, CS26 and CS27. The comparison unit 220f in FIG. 11 may be substantially the same as the comparison unit 220a in FIG. 5, except that the number of the plurality of comparators 224a, 224b, 224c, 224d, 224e, 224f and 224g is changed.

The encoding unit 230f may include a priority encoder 232f that is configured to convert the plurality of comparison signals CS21, CS22, CS23, CS24, CS25, CS26 and CS27 into binary values to generate the digital signal DS. The priority encoder 232f may include a first input terminal IN20 receiving a power supply voltage VCC, a second input terminal IN21 receiving the comparison signal CS21, a third input terminal IN22 receiving the comparison signal CS22, a fourth input terminal IN23 receiving the comparison signal CS23, a fifth input terminal IN24 receiving the comparison signal CS24, a sixth input terminal IN25 receiving the comparison signal CS25, a seventh input terminal TN26 receiving the comparison signal CS26, an eighth input terminal IN27 receiving the comparison signal CS27, a first output terminal OUT20 outputting a first bit of the digital signal DS, a second output terminal OUT21 outputting a second bit of the digital signal DS, and a third output terminal OUT22 outputting a third bit of the digital signal DS.

In some example embodiments, based on the number of bits of the digital signal DS being X, where X is a natural number greater than or equal to two, all or at least some of the number of the plurality of comparators 224a, 224b, 224c, 224d, 224e, 224f and 224g included in the comparison unit 220f, the number of the plurality of comparison signals CS21, CS22, CS23, CS24, CS25, CS26 and CS27 generated from the comparison unit 220f, and/or the number of resistors R21, R22, R23, R24, R25, R26 and R27 included in the voltage generator 210f may be $(2^X-1)$. In an example of FIG. 11, X=3.

Although the analog-to-digital converters 200a and 200f generating the 2-bit or 3-bit digital signal DS are illustrated in FIGS. 5 and 11, some example embodiments are not limited thereto, and the number of bits of the digital signal DS may be changed according to some example embodiments.

Figure 12:
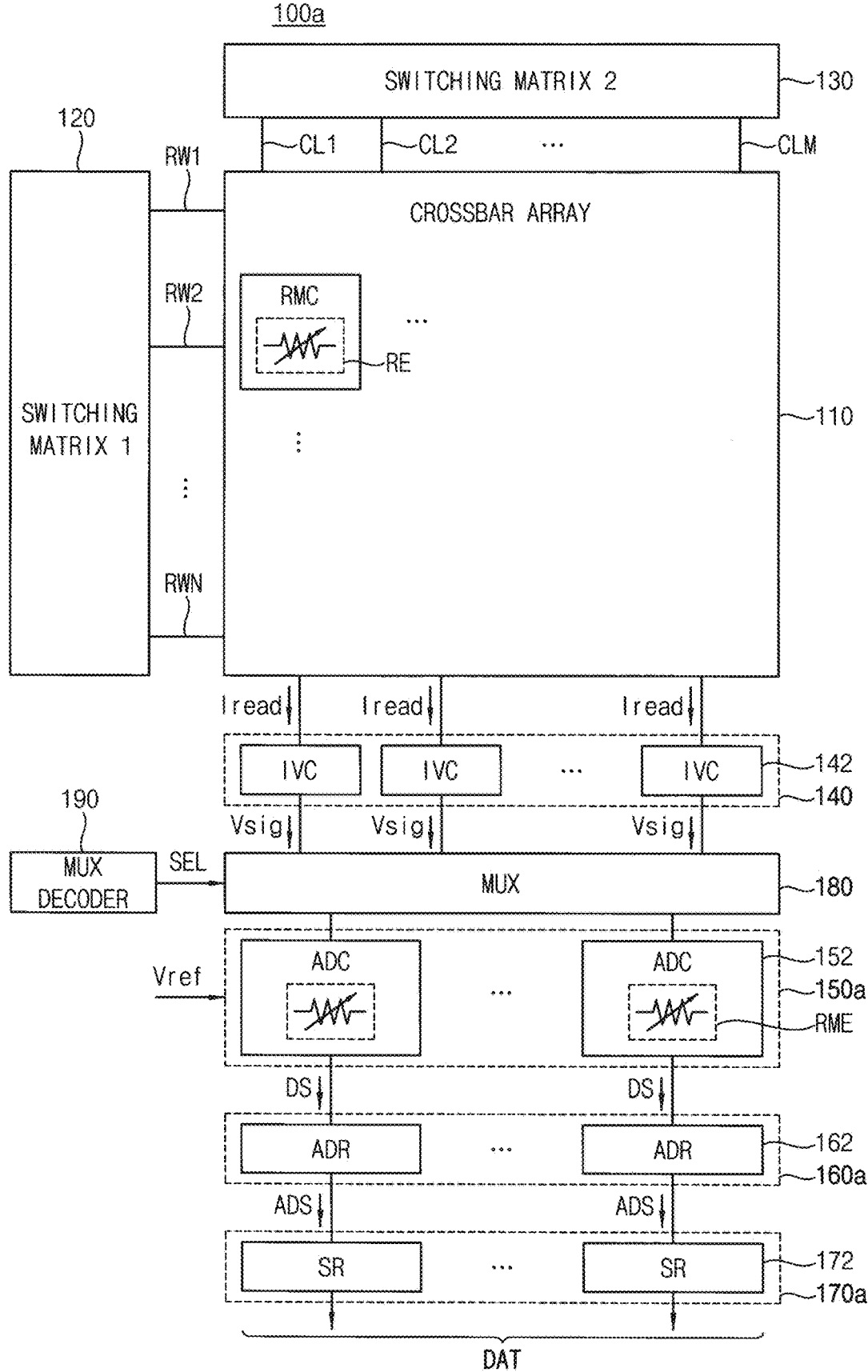
FIG. 12 is a block diagram illustrating a neuromorphic computing device according to some example embodiments.

FIG. 12 is a block diagram illustrating a neuromorphic computing device according to some example embodiments. The descriptions repeated with FIG. 1 will be omitted.

Referring to FIG. 12, a neuromorphic computing device 100a includes a crossbar array 110 and an analog-to-digital conversion block 150a. The neuromorphic computing device 100a may further include a first switching matrix 120, a second switching matrix 130, a current-to-voltage conversion block 140, an adder block 160a, a shift register block 170a, a multiplexer (MUX) 180 and a multiplexer decoder 190.

The neuromorphic computing device 100a of FIG. 12 may be substantially the same as the neuromorphic computing device 100 of FIG. 1, except that the neuromorphic computing device 100a further includes the multiplexer 180 and the multiplexer decoder 190 and configurations of the analog-to-digital conversion block 150a, the adder block 160a and the shift register block 170a are changed.

In some example embodiments and as shown in FIG. 12, the number of the plurality of analog-to-digital converters 152, the number of the plurality of adders 162 and the number of the plurality of shift registers 172 may be less than the number of the plurality of columns CL1, CL2, . . . , CLM of the crossbar array 110. For example, one analog-to-digital converter 152, one adder 162 and one shift register 172 may be shared by two or more columns, and thus a size of the neuromorphic computing device 100a may be reduced.

The multiplexer decoder 190 may be configured to generate a selection signal SEL for controlling an operation of the multiplexer 180. The multiplexer 180 may be between the crossbar array 110 and the analog-to-digital conversion block 150a (e.g., between the current-to-voltage conversion block 140 and the analog-to-digital conversion block 150a), and may connect one of the plurality of columns CL1, CL2, . . . , CLM of the crossbar array 110 (e.g., one of the plurality of current-to-voltage converters 142 or one of the plurality of signal voltages Vsig) with one of the plurality of analog-to-digital converters 152.

For example, the one analog-to-digital converter 152 may be shared by two columns CL1 and CL2, and the above-described operations may be performed first by connecting the column CL1 with the one analog-to-digital converter 152, and then the above-described operations may be performed by connecting the column CL2 with the same analog-digital converter 152.

Although not illustrated in FIG. 12, in some example embodiments, the multiplexer 180 may be between the crossbar array 110 and the current-to-voltage conversion block 140 according to some example embodiments. In the example embodiment of FIG. 12, one current-to-voltage converter 142, one analog-to-digital converter 152, one adder 162 and one shift register 172 may be shared by two or more columns.

Figure 13:
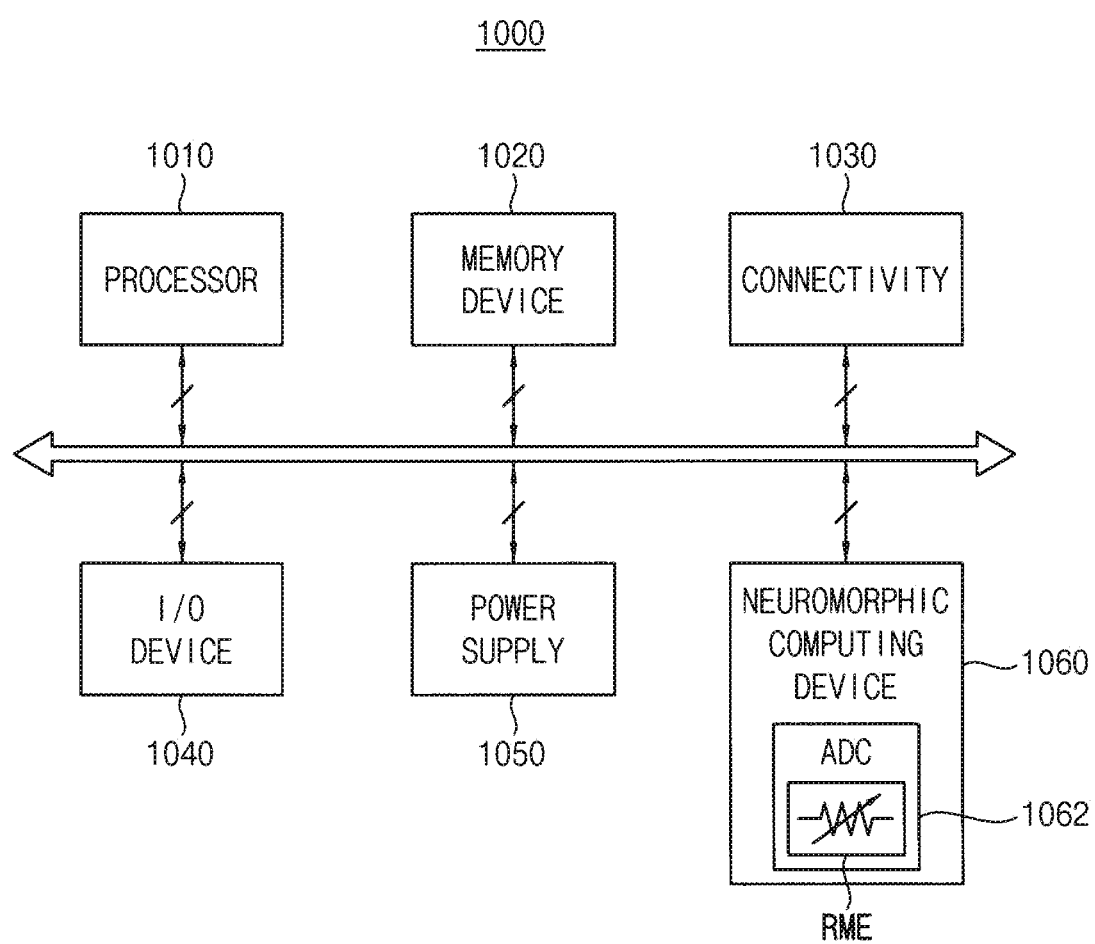
FIG. 13 is a block diagram illustrating an electronic system according to some example embodiments.

FIG. 13 is a block diagram illustrating an electronic system according to some example embodiments.

Referring to FIG. 13, an electronic system 1000 may include processing circuitry 1010, a memory device 1020, a connectivity module 1030, an input/output (I/O) device 1040, a power supply 1050 and a neuromorphic computing device 1060. The electronic system 1000 may further include a plurality of ports for communicating a video card, a sound card, a memory card, a universal serial bus (USB) device, other electronic devices, etc.

The processor 1010 controls operations of the electronic system 1000. In some example embodiments, the processor 1010 may include and/or serve as the processing circuitry (such as the comparison unit 220 and/or the encoding unit 230), or vice versa. The processor 1010 may be configured to execute an operating system and at least one application to provide an internet browser, games, videos, or the like. The memory device 1020 may be configured to store data for operations of the electronic system 1000. The connectivity module 1030 may be configured to communicate with an external device (not illustrated). The I/O device 1040 may include an input device such as a keyboard, a keypad, a mouse, a touchpad, a touch-screen, a remote controller, etc., and an output device such as a printer, a speaker, etc. The power supply 1050 may be configured to provide power for operations of the electronic system 1000.

The neuromorphic computing device 1060 may be configured to drive and/or execute a neural network system, and may be the neuromorphic computing device 100 according to some example embodiments. The neuromorphic computing device 1060 may include an analog-to-digital converter 1062. The analog-to-digital converter 1062 may include at least one resistive memory element RME including the same or similar resistive material as the resistive element RE included in the crossbar array 110, and may be the analog-to-digital converter 200 according to some example embodiments.

Some example embodiments of some inventive concepts may include various electronic devices and/or systems including the neuromorphic computing devices and/or the neural network system. For example, some example embodiments of some inventive concepts may include systems such as a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, etc.

The foregoing is illustrative of some example embodiments and is not to be construed as limiting thereof. Although some example embodiments have been described, those skilled in the art will readily appreciate that many modifications may be possible in some example embodiments without materially departing from the teachings and potential advantages of such example embodiments. Accordingly, all such modifications are intended to be included within the scope of some example embodiments as defined in the claims. Therefore, it is to be understood that the foregoing is illustrative of various example embodiments and is not to be construed as limited to the specific example embodiments disclosed, and that modifications to the disclosed example embodiments, as well as some other example embodiments, are intended to be included within the scope of the appended claims.

What is claimed is:

1. An analog-to-digital converter connected to a crossbar array including a plurality of resistive memory cells, each of the plurality of resistive memory cells including a resistive element, comprising:
   a voltage generator including,
      at least one resistive memory element including a same resistive material as the resistive element included in the crossbar array, the voltage generator configured to generate a first voltage based on a reference voltage and the at least one resistive memory element, and to divide the first voltage to generate at least one divided voltage, and
      a first transistor including a first electrode configured to receive the reference voltage, a second electrode, and a third electrode connected together; and
   processing circuitry configured to,
      compare a signal voltage from the crossbar array with at least one of the at least one divided voltage to generate at least one comparison signal; and
      generate at least one digital signal corresponding to the signal voltage based on the at least one comparison signal.

2. The analog-to-digital converter of claim 1, wherein the voltage generator includes:
   a second transistor including a first electrode configured to receive the reference voltage, a third electrode connected to the third electrode of the first transistor, and a second electrode outputting the first voltage;

a first resistive memory element connected between the second electrode of the first transistor and a ground voltage, the first resistive memory element including the same resistive material as the resistive element; and at least one resistor connected in series between the second electrode of the second transistor and the ground voltage.

3. The analog-to-digital converter of claim 2, wherein a number of the at least one resistors is equal to a number of the at least one divided voltage.

4. The analog-to-digital converter of claim 1, wherein the voltage generator includes:

a second transistor including a first electrode configured to receive the reference voltage, a third electrode connected to the third electrode of the first transistor, and a second electrode outputting the first voltage;

a plurality of resistive memory elements connected in series between the second electrode of the first transistor and a ground voltage, each of the plurality of resistive memory elements including the same resistive material as the resistive element; and at least one resistor connected in series between the second electrode of the second transistor and the ground voltage.

5. The analog-to-digital converter of claim 4, wherein a number of the plurality of resistive memory elements is determined based on the reference voltage and a read voltage for reading the plurality of resistive memory cells included in the crossbar array.

6. The analog-to-digital converter of claim 4, wherein the voltage generator further includes:

a write driver connected to the plurality of resistive memory elements, the write driver configured to perform a write operation to set each of the plurality of resistive memory elements to a target resistance.

7. The analog-to-digital converter of claim 6, wherein the write driver is configured to perform the write operation based on an update of data stored in the plurality of resistive memory cells included in the crossbar array.

8. The analog-to-digital converter of claim 6, wherein the write driver is configured to perform the write operation to set the plurality of resistive memory elements to different resistances relative to one another.

9. The analog-to-digital converter of claim 6, wherein the write driver is configured to perform the write operation to set at least one of the plurality of resistive memory elements to a maximum resistance.

10. The analog-to-digital converter of claim 6, wherein the voltage generator further includes:

a switching matrix configured to select a target resistive memory element on which the write operation is to be performed among the plurality of resistive memory elements.

11. The analog-to-digital converter of claim 4, wherein the plurality of resistive memory elements include:

a first group of resistive memory elements connected in series between the second electrode of the first transistor and the ground voltage; and a second group of resistive memory elements connected in series between the second electrode of the first transistor and the ground voltage, the second group of resistive memory elements and the first group of resistive memory elements being connected in parallel to each other.

12. The analog-to-digital converter of claim 11, wherein the voltage generator further includes:

a write driver connected to the plurality of resistive memory elements, the write driver configured to perform a write operation to set each of the plurality of resistive memory elements to a target resistance.

13. The analog-to-digital converter of claim 12, wherein:

the write driver is configured to perform the write operation to set the first group of resistive memory elements to different resistances relative to one another and to set the second group of resistive memory elements to different resistances relative to one another, and the write driver is configured to perform the write operation to set each of the first group of resistive memory elements and a respective one of the second group of resistive memory elements that are connected in parallel to each other to a same resistance relative to one another.

14. The analog-to-digital converter of claim 1, wherein:

the processing circuitry includes at least one comparator configured to generate at least one comparison signal, and when a number of bits of the digital signal is X, where X is a natural number greater than or equal to one, a number of the at least one comparison signal and a number of the at least one comparators are $(2^x-1)$.

15. A neuromorphic computing device comprising:

a crossbar array including a plurality of resistive memory cells, the crossbar array configured to store a plurality of data and to generate at least one signal voltage based on at least one input voltage and at least one data, each of the plurality of resistive memory cells including a resistive element; and at least one analog-to-digital converter configured to convert the at least one signal voltage into at least one digital signal, wherein each of the at least one analog-to-digital converter includes a voltage generator including at least one resistive memory element including a same resistive material as the resistive element included in the crossbar array, and a first transistor including a first electrode configured to receive a reference voltage, a second electrode, and a third electrode connected to each other, and wherein each of the at least one analog-to-digital converter is configured to generate a first voltage based on a reference voltage and the at least one resistive memory element, to divide the first voltage to generate at least one divided voltage, to compare one of the at least one signal voltage with the at least one divided voltage to generate at least one comparison signal, and to generate one of the at least one digital signal based on the at least one comparison signal.

16. The neuromorphic computing device of claim 15, wherein:

each of the at least one data represents a weight included in at least one layer of a neural network system, and each of the at least one signal voltage represents a result of multiplication and accumulation operations performed by the neural network system.

17. The neuromorphic computing device of claim 15, wherein a number of the at least one analog-to-digital converter is equal to a number of at least one column of the crossbar array.

18. The neuromorphic computing device of claim 15, wherein a number of the at least one analog-to-digital converter is less than a number of a plurality of columns of the crossbar array.

19. The neuromorphic computing device of claim 18, further comprising:
a multiplexer between the crossbar array and the at least one analog-to-digital converter, the multiplexer configured to connect one of the plurality of columns of the crossbar array with one of the at least one analog-to-digital converter.

20. A neuromorphic computing device comprising:
a crossbar array including a plurality of resistive memory cells, the crossbar array configured to store a plurality of weights included in at least one layer of a neural network system, and to generate a plurality of read currents based on a plurality of input voltages and the plurality of weights, each of the plurality of resistive memory cells including a resistive element, the plurality of read currents representing a result of multiplication and accumulation operations performed by the neural network system;
a first switching matrix connected to a plurality of rows of the crossbar array;
a second switching matrix connected to a plurality of columns of the crossbar array;
a plurality of current-to-voltage converters configured to convert the plurality of read currents into a plurality of signal voltages;
a plurality of analog-to-digital converters configured to convert the plurality of signal voltages into a plurality of digital signals;
a plurality of adders configured to sum the plurality of digital signals; and
a plurality of shift registers configured to generate final output data based on an output of the plurality of adders,
each of the plurality of analog-to-digital converters including:
a voltage generator including
at least one resistive memory element including a same resistive material as the resistive element included in the crossbar array, the voltage generator configured to generate a first voltage based on a reference voltage and the at least one resistive memory element, and to divide the first voltage to generate a plurality of divided voltage, the reference voltage being a voltage independent with respect to temperature and time, and
a first transistor including a first electrode configured to receive the reference voltage, a second electrode, and a third electrode connected to each other;
a comparison unit configured to compare one of the plurality of signal voltages with the plurality of divided voltages to generate at least one comparison signal; and
an encoding unit configured to generate one of the plurality of digital signals based on the at least one comparison signal.

\* \* \* \* \*